US010924119B1

(12) United States Patent
Tak

(10) Patent No.: US 10,924,119 B1
(45) Date of Patent: Feb. 16, 2021

(54) CLOCK DATA RECOVERY CIRCUIT AND APPARATUS INCLUDING THE SAME

(71) Applicant: Samsung Electronics Co., Ltd., Suwon-si (KR)

(72) Inventor: Geumyoung Tak, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/000,601

(22) Filed: Aug. 24, 2020

(30) Foreign Application Priority Data

Dec. 10, 2019 (KR) .................. 10-2019-0163979

(51) Int. Cl.
*H03L 7/08* (2006.01)
*H03L 7/085* (2006.01)
*H03K 3/037* (2006.01)
*H03L 7/107* (2006.01)
*H03L 7/199* (2006.01)

(52) U.S. Cl.
CPC ........... *H03L 7/0807* (2013.01); *H03K 3/037* (2013.01); *H03L 7/085* (2013.01); *H03L 7/1075* (2013.01); *H03L 7/199* (2013.01)

(58) Field of Classification Search
CPC combination set(s) only.
See application file for complete search history.

(56) References Cited

U.S. PATENT DOCUMENTS

| 4,542,351 | A | * | 9/1985 | Okada | ................ | G11B 20/1403 |
| | | | | | | 331/11 |
| 4,926,447 | A | * | 5/1990 | Corsetto | ................. | H04L 7/033 |
| | | | | | | 327/156 |
| 5,936,430 | A | | 8/1999 | Patterson | | |
| 6,301,318 | B1 | | 10/2001 | Wei et al. | | |
| 7,039,148 | B1 | * | 5/2006 | Lamb | ..................... | H03L 7/087 |
| | | | | | | 326/93 |
| 7,482,841 | B1 | | 1/2009 | Nguyen et al. | | |
| 7,940,088 | B1 | * | 5/2011 | Sampath | ................. | H03L 7/089 |
| | | | | | | 327/12 |
| 8,315,349 | B2 | | 11/2012 | Badalone | | |
| 8,536,911 | B1 | * | 9/2013 | Nakamuta | ................. | H03L 7/06 |
| | | | | | | 327/156 |

(Continued)

FOREIGN PATENT DOCUMENTS

JP 3154302 B2 4/2001
JP 3343148 B2 11/2002

*Primary Examiner* — Adam D Houston
(74) *Attorney, Agent, or Firm* — Harness, Dickey & Pierce, P.L.C.

(57) ABSTRACT

A clock data recovery circuit configured to receive an input data signal that includes an embedded clock signal includes a clock recovery circuit including a phase detector configured to detect a phase of the embedded clock signal and to generate a recovery clock signal from the input data signal based on the detected phase; and a data recovery circuit configured to generate a recovery data signal from the input data signal by using the recovery clock signal. The phase detector includes a sampling latch circuit configured to output a first sample signal and a second sample signal from the input data signal; and an edge detection circuit configured to generate a phase control signal based on the first sample signal and the second sample signal and output the phase control signal in a period in which the second sample signal is output from the sampling latch circuit.

20 Claims, 17 Drawing Sheets

(56) References Cited

U.S. PATENT DOCUMENTS

| | | | |
|---|---|---|---|
| 8,798,217 | B2 | 8/2014 | Kong et al. |
| 9,077,350 | B2 | 7/2015 | Na et al. |
| 9,813,069 | B1 | 11/2017 | Chattopadhyay et al. |
| 2001/0033188 | A1* | 10/2001 | Aung ................ H03L 7/0814 327/141 |
| 2001/0049812 | A1* | 12/2001 | Lutkemeyer ......... H03L 7/0814 327/149 |
| 2002/0025015 | A1* | 2/2002 | Notani ................ H03L 7/0895 375/376 |
| 2002/0070778 | A1* | 6/2002 | Dairi ..................... H03L 7/197 327/156 |
| 2002/0084815 | A1* | 7/2002 | Murphy ............... H03D 13/004 327/157 |
| 2006/0208793 | A1* | 9/2006 | Morishima ............. H03F 3/217 330/10 |
| 2007/0021933 | A1* | 1/2007 | Sanduleanu ........... H03L 7/107 702/72 |
| 2009/0039927 | A1* | 2/2009 | Gillingham .......... G11C 7/1045 327/156 |
| 2010/0110848 | A1* | 5/2010 | Honma ............ G11B 20/10037 369/47.48 |
| 2011/0285438 | A1* | 11/2011 | Kinugasa ............... H03L 7/087 327/157 |
| 2014/0062529 | A1* | 3/2014 | Ramachandra ......... G06F 7/501 326/35 |
| 2016/0080178 | A1* | 3/2016 | Chen .................... H04L 7/0087 375/233 |
| 2017/0184664 | A1* | 6/2017 | Nicolaidis ........ G01R 31/31703 |
| 2017/0187364 | A1* | 6/2017 | Park ..................... H03L 7/0814 |
| 2018/0102863 | A1* | 4/2018 | Royle ................... H04J 3/0697 |

* cited by examiner

CLOCK DATA RECOVERY CIRCUIT AND APPARATUS INCLUDING THE SAME

CROSS-REFERENCE TO RELATED APPLICATION

This application claims the benefit of Korean Patent Application No. 10-2019-0163979, filed on Dec. 10, 2019, in the Korean Intellectual Property Office, the disclosure of which is incorporated herein in its entirety by reference.

BACKGROUND

1. Field

At least some example embodiments of the inventive concepts relate to recovery of a data signal including an embedded clock signal, and more particularly, to a clock data recovery circuit and an apparatus including the same.

2. Related Art

In order to transmit data at a high speed, a serial communication method may be used. The serial communication method may be used for various applications such as communication among parts included in a system as well as communication among independent devices through a removable port and movement of data in an integrated circuit.

The clock data recovery circuit for generating a recovery clock signal from serial data by detecting a phase of a clock signal embedded in serial data and generating recovery data from the serial data by using the recovery clock signal may be used in various devices and applications for transmitting and receiving data by the serial communication method. On the other hand, in the serial communication method, as a data transfer rate remarkably increases, it is difficult for the clock data recovery circuit to generate reliable recovery data.

SUMMARY

At least some example embodiments of the inventive concepts relate to clock data recovery, and more particularly, to a clock data recovery circuit for correctly recovering a clock signal and data from an input data signal and an apparatus including the same.

According to at least some example embodiments of the inventive concepts, a clock data recovery circuit configured to receive an input data signal including an embedded clock signal includes a clock recovery circuit including a phase detector configured to detect a phase of the embedded clock signal and to generate a recovery clock signal from the input data signal based on the detected phase; and a data recovery circuit configured to generate a recovery data signal from the input data signal by using the recovery clock signal, wherein the phase detector includes a sampling latch circuit configured to output a first sample signal from the input data signal at a first edge of a first reference clock signal in a period from the first edge of the first reference clock signal to a second edge of the first reference clock signal and output a second sample signal from the input data signal at a first edge of a second reference clock signal having a predetermined phase difference from the first reference clock signal in a period from the first edge of the second reference clock signal to a second edge of the second reference clock signal; and an edge detection circuit configured to generate a phase control signal based on the first sample signal and the second sample signal and output the phase control signal in a period in which the second sample signal is output from the sampling latch circuit.

According to at least some example embodiments of the inventive concepts, a phase detector configured to detect a phase of an embedded clock signal by using an input data signal including the embedded clock signal and a plurality of reference clock signals having different phases includes a sampling latch circuit configured to sequentially output sample signals from the input data signal at edges of the plurality of reference clock signals; an edge detection circuit configured to perform a comparison operation by using the sample signals, generate a phase control signal for tracking a phase of the embedded clock signal based on a result of the comparison operation, reset the phase control signal in a first period, and fixing the phase control signal to a predetermined level; and a pulse adjustment circuit configured to set the phase control signal to have a level in accordance with the operation result in a second period following the first period, and control the phase control signal to hold a level in accordance with the operation result in a third period following the second period.

According to at least some example embodiments of the inventive concepts, an apparatus configured to receive a serial communication-based input data signal includes a clock recovery circuit including a phase detector for generating a recovery clock signal from the serial communication-based input data signal, wherein the phase detector includes a sampling latch circuit configured to output a first sample signal from the input data signal at a first edge of a first reference clock signal in a period from the first edge of the first reference clock signal to a second edge of the first reference clock signal, and output a second sample signal from the input data signal at a first edge of a second reference clock signal having a first phase difference from the first reference clock signal in a period from the first edge of the second reference clock signal to a second edge of the second reference clock signal; an edge detection circuit configured to perform a comparison operation on the first sample signal and the second sample signal from a point in time at which the first sample signal and the second sample signal start to be received from the sampling latch circuit, and generate a phase control signal configured to control phases of the first reference clock signal and the second reference clock signal based on a result of the comparison operation; and a pulse adjustment circuit configured to increase a pulse width of the phase control signal received from the edge detection circuit.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
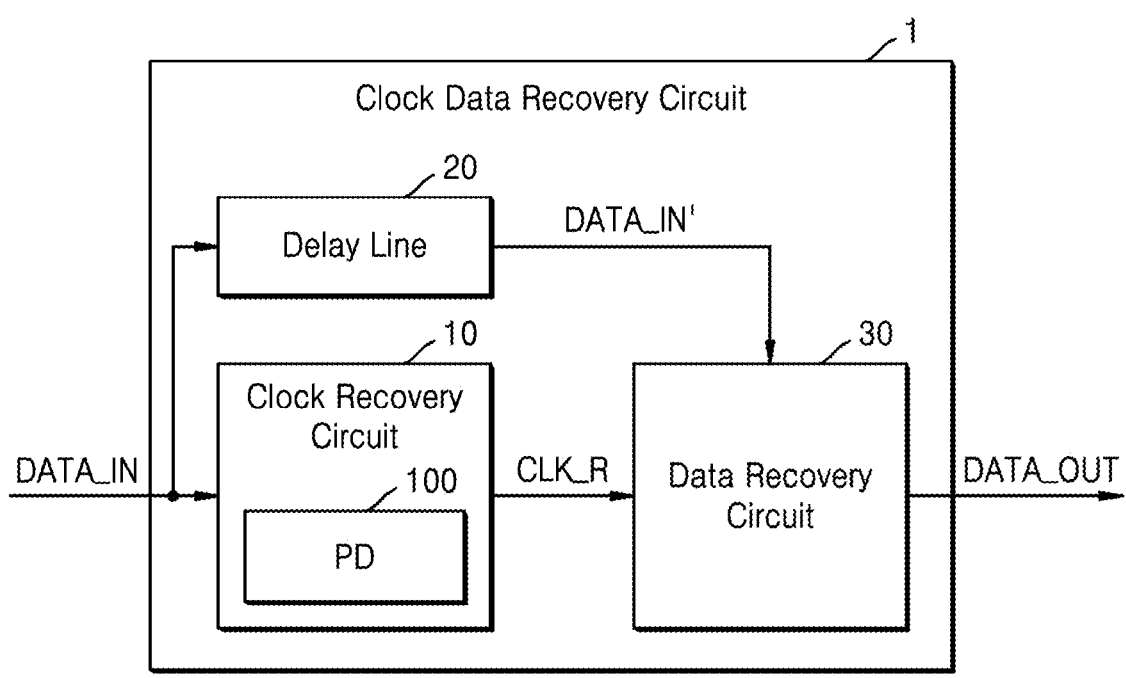
FIG. 1 is a block diagram illustrating a clock data recovery circuit according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a clock data recovery circuit 1 according to at least some example embodiments of the inventive concepts. In some embodiments, the clock data recovery circuit 1 may be manufactured by semiconductor processes and may be included in a semiconductor device as an integrated circuit. In addition, the clock data recovery circuit 1 may be included in a receiving circuit (or a receiver) for receiving data based on a serial communication method. The clock data recovery circuit 1 may receive an input data signal DATA_IN transmitted by a transmission circuit (or a transmitter) based on the serial communication method and may generate an output data signal DATA_OUT from the input data signal DATA_IN. On the other hand, the output data signal DATA_OUT may be referred to as a recovery data signal.

Referring to FIG. 1, the clock data recovery circuit 1 may include a clock recovery circuit 10, a delay line 20, and a data recovery circuit 30. The input data signal DATA_IN may include serial bits, that is, a bit sequence. For example, the input data signal DATA_IN may include a packet of sequentially arranged m bits. The clock data recovery circuit 1 may recognize serial data included in the input data signal DATA_IN by sampling (or capturing) the bit sequence included in the input data signal DATA_IN and may generate the output data signal DATA_OUT including parallel data from the serial data.

In some embodiments, the input data signal DATA_IN may include a clock signal as well as the serial data. When the data signal including the serial data is received from a transmission circuit through a data line and a clock signal is separately received through a clock line, the receiving circuit may not easily receive the data signal and the clock signal in synchronization with each other due to various factors and it may be limited to increase a data transfer rate. On the other hand, when the transmission circuit has the clock signal included in the data signal and the receiving circuit recognizes the serial data by recovering the clock signal included in the data signal, the receiving circuit may sample the bit sequence by recovering the clock signal including a change in data signal so that the data transfer rate may increase. Hereinafter, the clock signal included in the input data signal DATA_IN may be referred to as an embedded clock signal.

The clock recovery circuit 10 according to at least some example embodiments of the inventive concepts may include a phase detector (PD) 100. According to at least some example embodiments the PD 100 circuitry configured to detect a phase of the embedded clock signal of the input data signal DATA_IN by preventing a garbage pulse from being generated. The PD 100 may also be referred to, in the present specification, as the PD circuit 100. Hereinafter, an operation of detecting the phase of the embedded clock signal of the input data signal DATA_IN may be described as an operation of detecting a phase of the input data signal DATA_IN. In some embodiments, the PD 100 may be implemented by a bang-bang PD. The clock recovery circuit 10 may receive the input data signal DATA_IN and may generate a recovery clock signal CLK_R from the input data signal DATA_IN.

The PD 100 may detect the phase of the input data signal DATA_IN by sampling the input data signal DATA_IN by using a plurality of reference clock signals having different phases and comparing sampled signals generated as a result of sampling the input data signal DATA_IN with each other. The PD 100 may generate a phase control signal based on the detection result in order to control a phase of a source clock signal of reference clock signals and may prevent the garbage pulse that may be included in the phase control signal from being generated. A detailed description of the phase control signal for controlling the phase of the source clock signal of the reference clock signals is given later.

According to at least one example embodiment of the inventive concepts, the PD 100 may reset the phase control signal to be at a desired or, alternatively, predetermined level and may fix the phase control signal to the desired or, alternatively, predetermined level in a period in which the phase control signal does not include a result of comparing the sampled signals with each other, that is, the phase control signal has a 'null' value. The desired or, alternatively, predetermined level may be determined to reduce or, alternatively, minimize an influence on the PD 100 performing a phase detecting operation. In addition, the PD 100 may adjust a pulse width of the phase control signal so that a charge pumping operation of a charge pump circuit (not shown) to which the phase control signal is applied may be sufficiently performed. For example, when the pulse width of the phase control signal is small, the charge pump circuit (not shown) may not sufficiently perform the charge pumping operation. As a result, the phase of the source clock signal may not be controlled as desired so that the recovery clock signal CLK_R may not be correctly generated. Therefore, the PD 100 may correctly generate the recovery clock signal CLK_R by increasing the pulse width of the phase control signal.

The delay line 20 may receive the input data signal DATA_IN and may control the input data signal DATA_IN by an amount of delay of the input data signal DATA_IN, which is performed by the clock recovery circuit 10. The delay line 20 may include a component replicated from the clock recovery circuit 10. In some embodiments, in the delay line 20, an amount of delay may be adjusted by controlling a voltage. The delay line 20 may control the input data signal DATA_IN and may provide a delayed input data signal DATA_IN' to the data recovery circuit 30.

The data recovery circuit 30 may generate an output data signal (or a recovery data signal) DATA_OUT by sampling the delayed input data signal DATA_IN' by using the recovery clock signal CLK_R. The output data signal DATA_OUT may be provided to internal processors, controllers, parts, and memories of a device including the clock data recovery circuit 1, an integrated circuit, and a chip.

The clock data recovery circuit 1 according to at least some example embodiments of the inventive concepts may prevent the garbage pulse from being generated when the phase of the embedded clock signal included in the input data signal DATA_IN is detected and may generate the recovery clock signal CLK_R with high reliability by adjusting a pulse width of a signal required for tracking the phase of the embedded clock signal.

Figure 2:
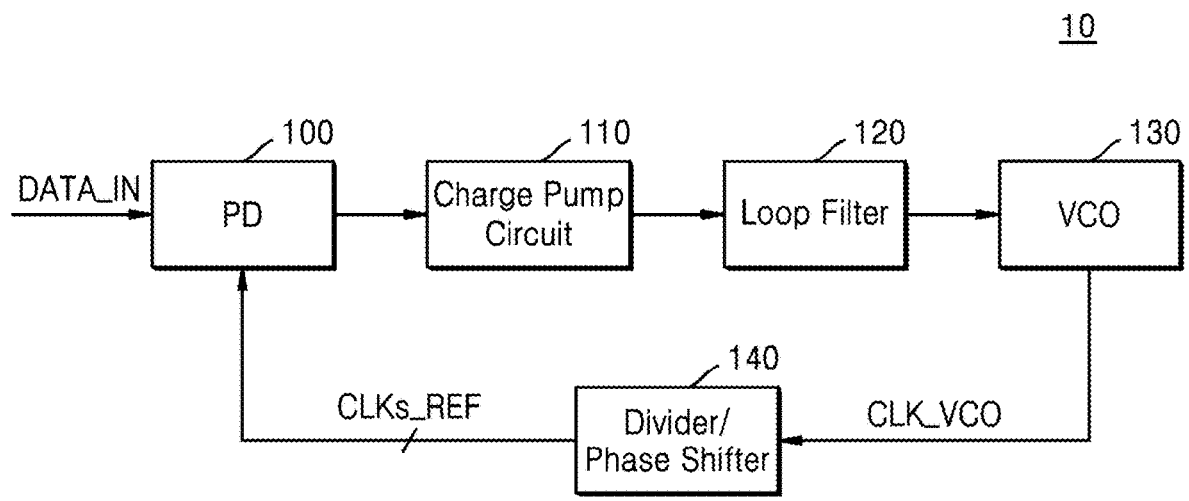
FIG. 2 is a block diagram illustrating a clock recovery circuit according to at least some example embodiments of the inventive concepts.

FIG. 2 is a block diagram illustrating a clock recovery circuit 10 according to at least some example embodiments of the inventive concepts.

Referring to FIG. 2, the clock recovery circuit 10 may include a PD 100, a charge pump circuit 110, a loop filter 120, a voltage controlled oscillator (VCO) 130, and a divider/phase shifter 140. The PD 100 may receive the input data signal DATA_IN and may receive a plurality of reference clock signals CLKs_REF from the divider/phase shifter 140. The divider/phase shifter 140 may generate the plurality of reference clock signals CLKs_REF by dividing a source clock signal CLK_VCO output from the VCO 130 and phase shifting the source clock signal CLK_VCO. The phase detector 100 may generate a phase control signal by detecting the phase of the input data signal DATA_IN by using the plurality of reference clock signals CLKs_REF.

The PD 100 may sequentially receive the reference clock signals CLKs_REF with different phases and may compare the phases of the sequentially received reference clock signals CLKs_REF with the phase of the input data signal DATA_IN. The PD 100 may perform a reset operation on a phase control signal considering a difference among times at which the reference clock signals CLKs_REF are received in order to prevent the garbage pulse of the phase control signal from being generated as the reference clock signals CLKs_REF are sequentially received. On the other hand, the PD 100 may increase the pulse width of the phase control signal so that a charge pumping operation of the charge pump circuit 110 may be sufficiently performed. A detailed structure, function, and operation of the PD 100 will be described later.

The charge pump circuit 110 may adjust charge supply in accordance with the phase control signal output from the PD 100. According to at least some example embodiments, the loop filter 120 includes a circuit or circuitry configured to output a voltage signal by accumulating the charge supply adjusted by the charge pump circuit 110. The loop filter 120 may also be referred to, in the present specification, as the loop filter circuit 120. According to at least some example embodiments, the VCO 130 may include a circuit or circuitry configured to generate the source clock signal CLK_VCO that varies in accordance with the voltage signal output from the loop filter 120. The VCO 130 may also be referred to, in the present specification, as the VCO circuit 130. According to at least some example embodiments of the inventive concepts, the divider/phase shifter 140 may include a circuit or circuitry configured to receive the source clock signal CLK_VCO and generate the reference clock signals CLKs_REF by modulating a phase or frequency of the source clock signal CLK_VCO. The divider/phase shifter 140 may also be referred to, in the present specification, as the divider/phase shifter circuit 140. The reference clock signals CLKs_REF may have different phases by the divider/phase shifter 140. The divider/phase shifter 140 may sequentially provide the reference clock signals CLKs_REF to the PD 100.

An embodiment of the clock recovery circuit 10 illustrated in FIG. 2 is only an example, and at least some example embodiments of the inventive concepts is not limited thereto. Various implementation examples for generating the recovery clock signal from the input data signal DATA_IN may be applied to the clock recovery circuit 10.

Figure 3:
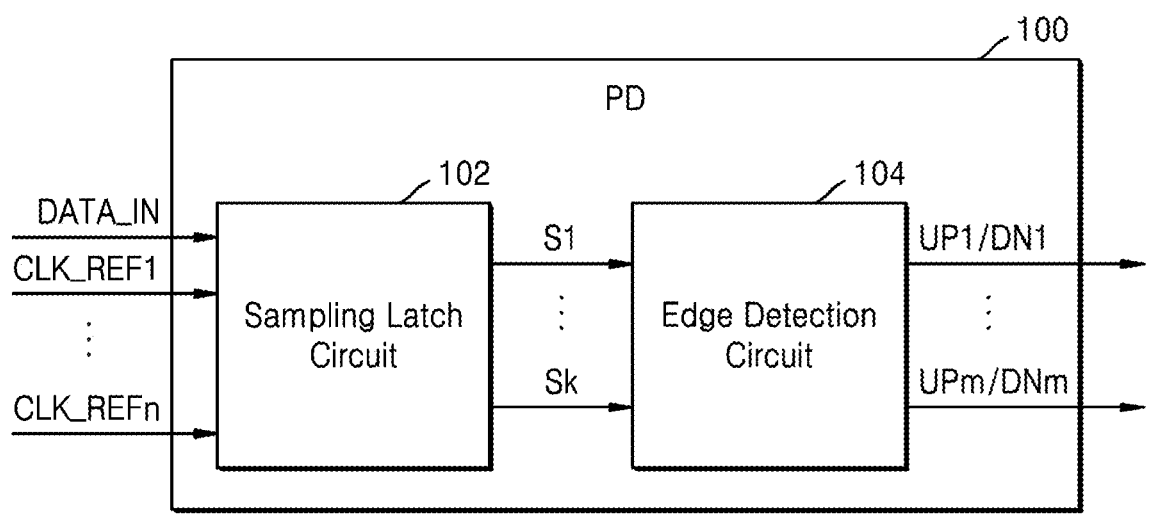
FIG. 3 is a block diagram illustrating a phase detector (PD) according to at least some example embodiments of the inventive concepts.

FIG. 3 is a block diagram illustrating a PD 100 according to at least some example embodiments of the inventive concepts.

Referring to FIG. 3, the PD 100 may include a sampling latch circuit 102 and an edge detection circuit 104.

According to at least one example embodiment of the inventive concepts, the sampling latch circuit 102 may receive the input data signal DATA_IN and first to nth reference clock signals CLK_REF1 to CLK_REFn with different phases. The sampling latch circuit 102 may sequentially output first to kth sample signals S1 to Sk sampled from the input data signal DATA_IN to the edge detection circuit 104 at edges of the first to nth reference clock signals CLK_REF1 to CLK_REFn.

According to at least one example embodiment of the inventive concepts, the edge detection circuit 104 may perform a comparison operation by using the first to kth sample signals S1 to Sk and may generate phase control signals UP1/DN1 to UPm/DNm for tracking the phase of the embedded clock signal of the input data signal DATA_IN based on the operation result. In addition, the edge detection circuit 104 may reset the phase control signals UP1/DN1 to UPm/DNm in a prescribed period in which the garbage pulse may be generated and may fix the reset phase control signals UP1/DN1 to UPm/DNm to a desired or, alternatively, predetermined level. The reset period may vary in accordance with the phase control signals UP1/DN1 to UPm/DNm. In addition, the reset period may correspond to a difference among points in time at which the first to kth sample signals S1 to Sk start to be output from the sampling latch circuit 102.

According to at least one example embodiment of the inventive concepts, the sampling latch circuit 102 may include a plurality of sampling latches for receiving the input data signal DATA_IN and one reference clock signal and outputting one sample signal and may further include a plurality of inverters for inverting the output of the plurality of sampling latches. The edge detection circuit 104 may include a plurality of edge detectors for receiving two sample signals and outputting one phase control signal. The plurality of edge detectors of the edge detection circuit 104 may perform a dynamic comparison operation when a prescribed condition is satisfied based on one of the two received sample signals, may generate the phase control signal based on the operation result, and may output the generated phase control signal.

In FIG. 3, the input data signal DATA_IN may include a positive input data signal DATA_INP and a negative input data signal DATA_INN and each of the first to kth sample signals S1 to Sk may include a positive sample signal and a negative sample signal. An implementation example for receiving the positive signal and the negative signal and detecting the phase of the input data signal DATA_IN may be applied to the sampling latch circuit 102 and the edge detection circuit 104, which will be described in detail later.

Figure 4:
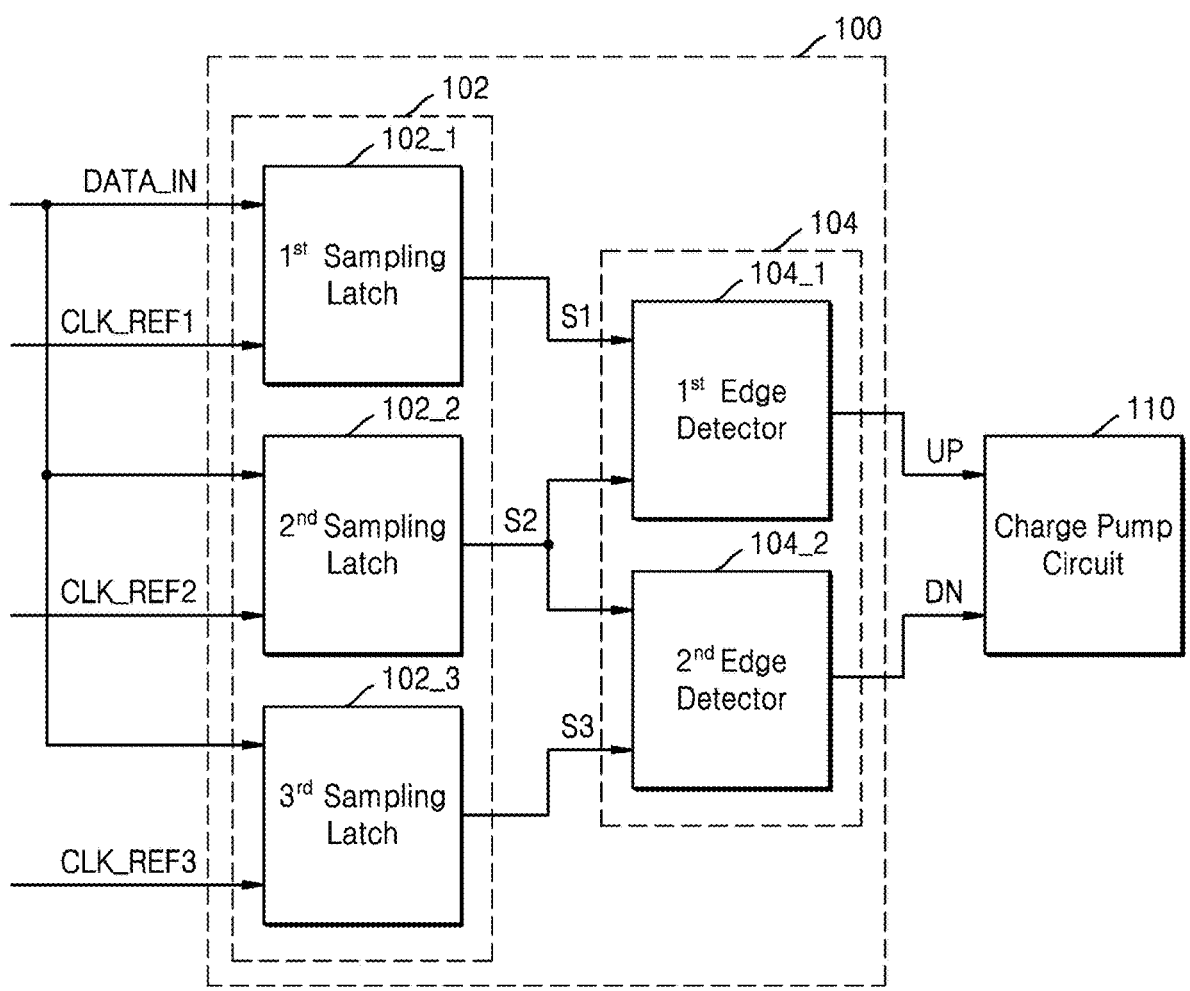
FIG. 4 is a block diagram illustrating the PD of FIG. 3 in detail.
Figure 5:
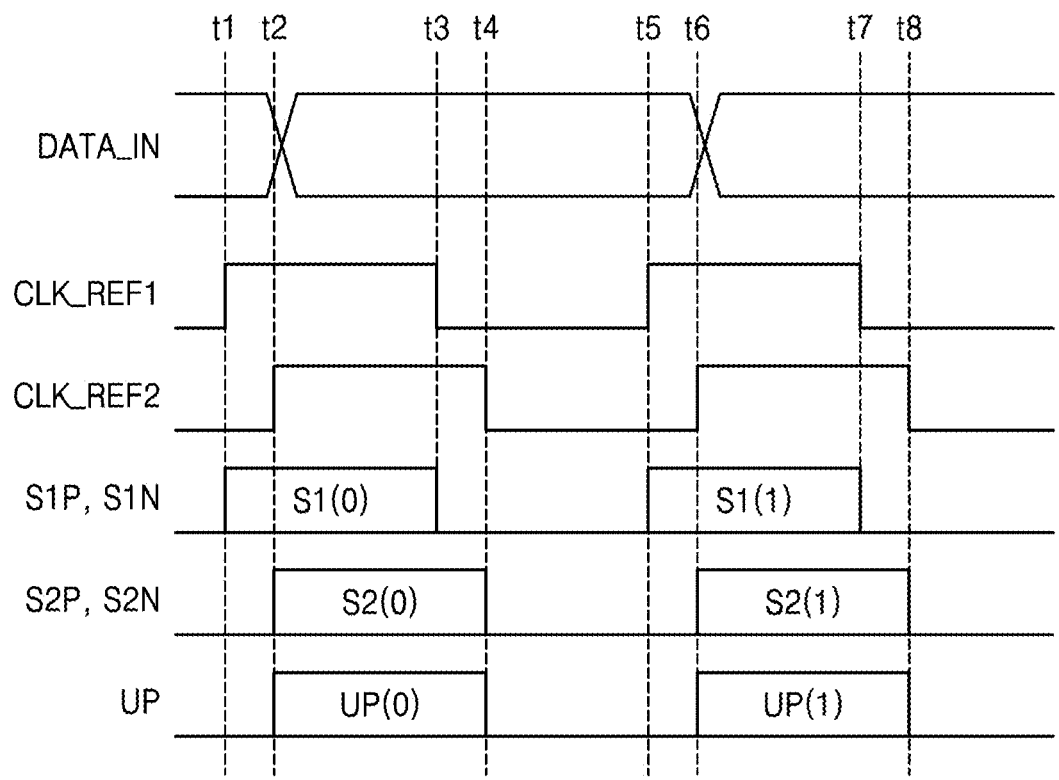
FIG. 5 is a timing diagram illustrating an operation of the PD of FIG. 4.

FIG. 4 is a block diagram illustrating the PD 100 of FIG. 3 in detail. FIG. 5 is a timing diagram illustrating an operation of the PD 100 of FIG. 4. In FIG. 4, for convenience sake, only a part of the PD 100 is illustrated. It will be understood that the at least one example of the inventive concepts applied to the illustrated component may be also applied to the remaining components (not shown).

Referring to FIG. 4, the PD 100 may include the sampling latch circuit 102 and the edge detection circuit 104. The sampling latch circuit 102 may include first to third sampling latches 102_1 to 102_3 and first and second edge detectors 104_1 and 104_2. According to at least some example embodiments, the first and second edge detectors 104_1 and 104_2 may each be implemented by a circuit or circuitry. The first and second edge detectors 104_1 and 104_2 may also be referred to, in the present specification, as first and second edge detector circuits 104_1 and 104_2. The first sampling latch 102_1 may receive the input data signal DATA_IN and the first reference clock signal CLK_REF1, may sample the input data signal DATA_IN at an edge of the first reference clock signal CLK_REF1, and may generate the first sample signal S1. The second sampling latch 102_2 may receive the input data signal DATA_IN and the second reference clock signal CLK_REF2, may sample the input data signal DATA_IN at an edge of the second reference clock signal CLK_REF2, and may generate the second sample signal S2. The third sampling latch 102_3 may receive the input data signal DATA_IN and the third reference clock signal CLK_REF3, may sample the input data signal DATA_IN at an edge of the third reference clock signal CLK_REF3, and may generate the third sample signal S3.

The first edge detector 104_1 may receive the first and second sample signals S1 and S2 from the first and second sampling latches 102_1 and 102_2, may perform a comparison operation on the first and second sample signals S1 and S2, and may generate a first phase control signal UP. The first phase control signal UP may advance the phase of the source clock signal. The second edge detector 104_2 may receive the second and third sample signals S2 and S3 from the second and third sampling latches 102_2 and 102_3, may perform a comparison operation on the second and third sample signals S2 and S3, and may generate a second phase control signal DN. The second phase control signal DN may be for delaying the phase of the source clock signal.

The edge detection circuit 104 may provide the first and second phase control signals UP and DN to the charge pump circuit 110, and the charge pump circuit 110 may perform a charge supply operation, based on the first and second phase control signals UP and DN.

Hereinafter, with reference to FIG. 5, operations of the first and second sampling latches 102_1 and 102_2 and the first edge detector 104_1 will be described in detail. It will be understood that, according to at least some example embodiments of the inventive concepts, the operations illustrated in FIG. 5 may be also applied to all the sampling latches and edge detectors included in the PD 100. On the other hand, the first and second sample signals S1 and S2 may respectively include positive sample signals S1P and S2P and negative sample signals S1N and S2N.

Referring to FIG. 5, the first sampling latch 102_1 may generate a first positive sample signal S1P(0) and a first negative sample signal S1N(0) by sampling the input data signal DATA_IN at a rising edge of the first reference clock signal CLK_REF1 at first time t1. Then, the first sampling latch 102_1 may output the first positive sample signal S1P(0) and the first negative sample signal S1N(0) to the first edge detector 104_1 for the first time t1 to third time t3 (or from a point in time of the rising edge of the first reference clock signal CLK_REF1 to a point in time of a subsequent falling edge of the first reference clock signal CLK_REF1). The second sampling latch 102_2 may generate a second positive sample signal S2P(0) and a second negative sample signal S2N(0) by sampling the input data signal DATA_IN at a rising edge of the second reference clock signal CLK_REF2 at second time t2. Then, the second sampling latch 102_2 may output the second positive sample signal S2P(0) and the second negative sample signal S2N(0) to the second edge detector 104_2 for the second time t2 to fourth time t4 (or from a point in time of the rising edge of the second reference clock signal CLK_REF2 to a point in time of a subsequent falling edge of the second reference clock signal CLK_REF2).

The first edge detector 104_1 may generate a phase control signal UP(0) by performing a comparison operation on the first positive sample signal S1P(0) and the second positive sample signal S2P(0) or performing a comparison operation on the first negative sample signal S1N(0) and the second negative sample signal S2N(0). Because the second positive sample signal S2P(0) and the second negative sample signal S2N(0) have meaningless values in a period between the first time t1 and the second time t2, it is necessary to reset the phase control signal UP(0) and to fix the phase control signal UP(0) to a desired or, alternatively, predetermined level. Therefore, the first edge detector 104_1 may reset the phase control signal UP(0) to be at a desired or, alternatively, predetermined level in the period between the first time t1 to the second time t2 (or a period from a point in time at which the first positive sample signal S1P(0)) and the first negative sample signal S1N(0) start to be output from the first sampling latch 102_1 to a point in time at which the second positive sample signal S2P(0)) and the second negative sample signal S2N(0) start to be output from the second sampling latch 102_2). For example, the desired or, alternatively, predetermined level may be a low level. Therefore, the phase control signal UP(0) may be fixed to a low level in the period between the first time t1 and the second time t2.

In addition, the first edge detector 104_1 may output the result of performing the comparison operation on the first positive sample signal S1P(0) and the second positive sample signal S2P(0) or performing the comparison operation on the first negative sample signal S1N(0) and the second negative sample signal S2N(0) to the charge pump circuit 110 in a period between the second time t2 and the fourth time t4. In some embodiments, a pulse width of the phase control signal UP(0) may be adjusted, which will be described in detail later.

By the above method, at fifth to eighth times t5 to t8, a phase control signal UP(1) may be also generated by using first sample signals S1P(1) and S1N(1), the second sample signals S2P(1) and S2N(1), and the first and second reference clock signals CLK_REF1 and CLK_REF2.

Figure 6:
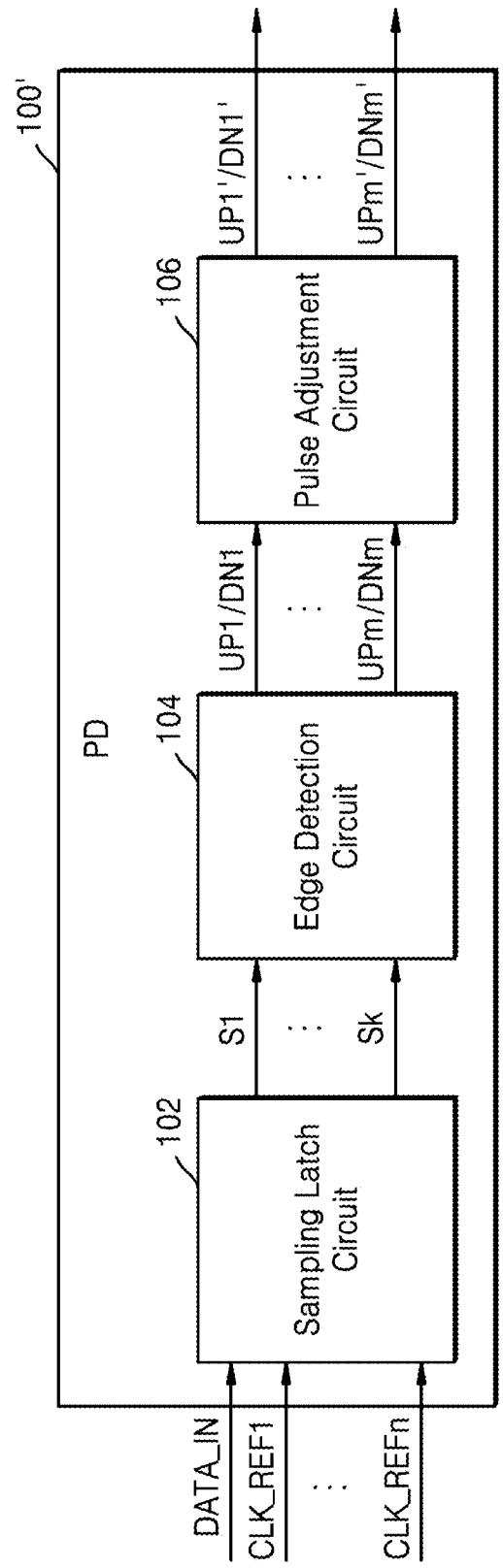
FIG. 6 is a block diagram illustrating a PD according to at least some example embodiments of the inventive concepts.

FIG. 6 is a block diagram illustrating a PD 100' according to at least some example embodiments of the inventive concepts. In FIG. 6, a difference between the PD 100 of FIG. 3 and the PD 100' of FIG. 6 will be mainly described.

Referring to FIG. 6, the PD 100' may include a sampling latch circuit 102, an edge detection circuit 104, and a pulse adjustment circuit 106. The pulse adjustment circuit 106 may adjust pulse widths of the phase control signals UP1/DN1 to UPm/DNm received from the edge detection circuit 104. In detail, the pulse adjustment circuit 106 may increase the pulse widths of the phase control signals UP1/DN1 to UPm/DNm. Although not shown in FIG. 6, the pulse adjustment circuit 106 may receive at least one of the first to kth sample signals S1 to Sk from the sampling latch circuit 102 and may increase the pulse widths of the phase control signals based on the received sample signal.

According to at least one example embodiment of the inventive concepts, the pulse adjustment circuit 106 may include a plurality of pulse adjusters for receiving one phase control signal and adjusting a pulse width of the received phase control signal and each of the pulse adjusters may include a latch. The pulse adjusters may perform a set operation and a hold operation based on the sample signals received by the sampling latch circuit 102 and may adjust the pulse width of the phase control signal by the hold operation.

Figure 7:
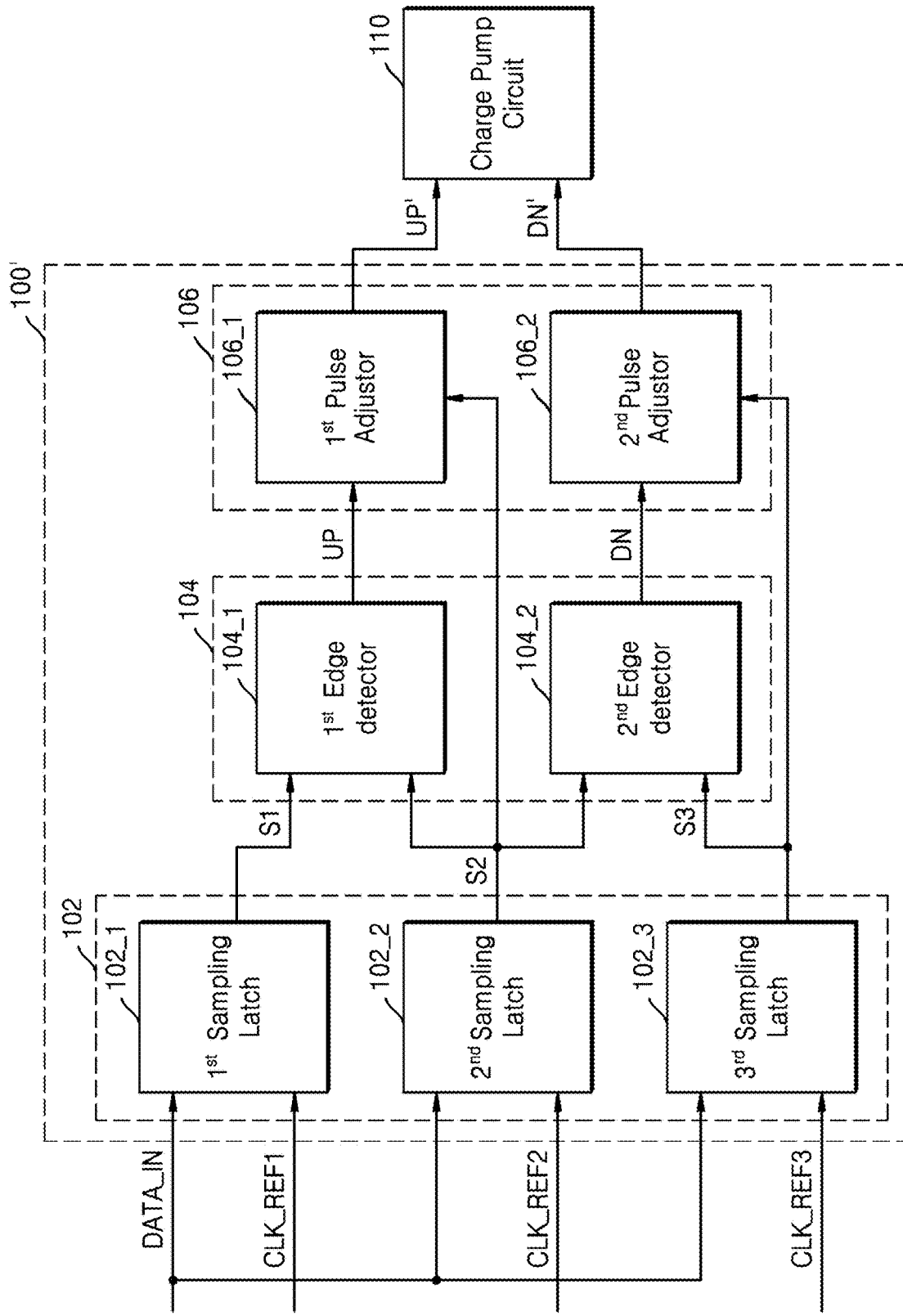
FIG. 7 is a block diagram illustrating the PD of FIG. 6 in detail.
Figure 8:
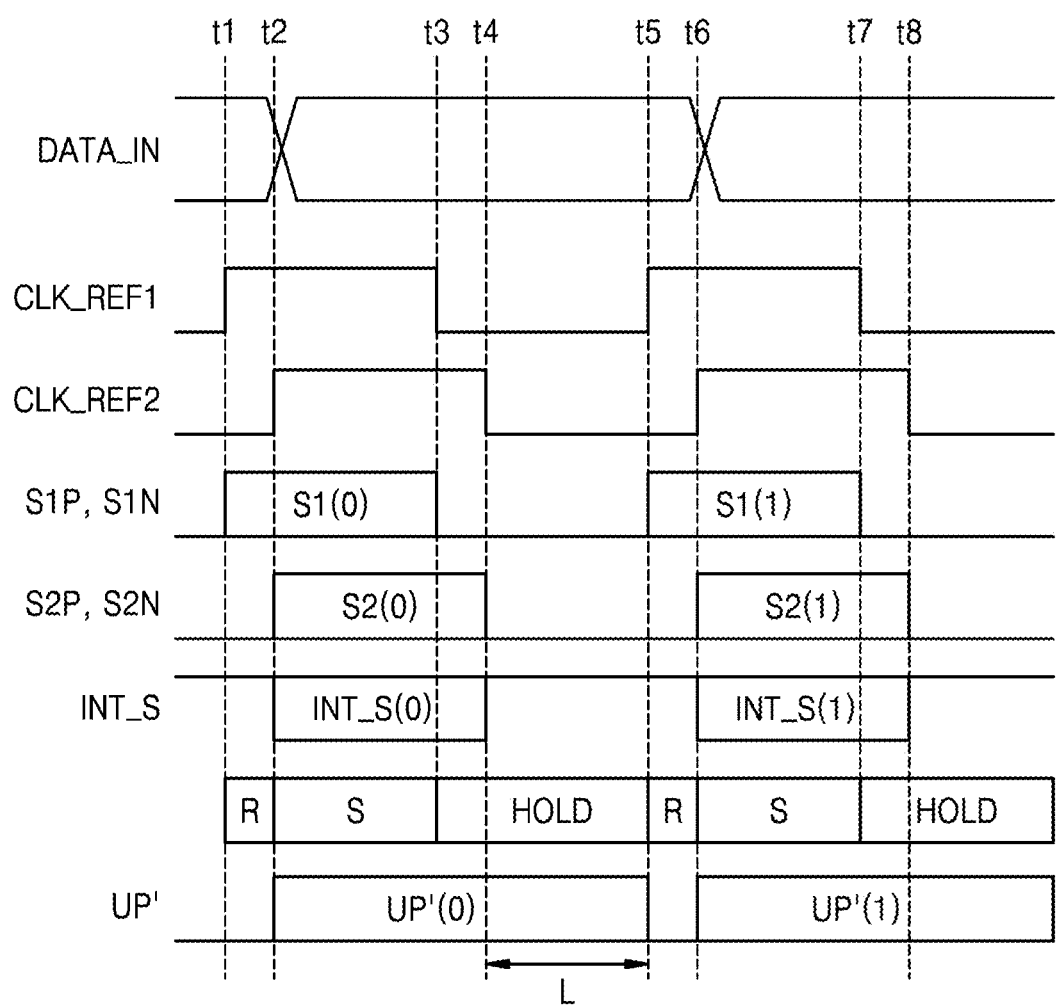
FIG. 8 is a timing diagram illustrating an operation of the PD of FIG. 7.

FIG. 7 is a block diagram illustrating the PD 100' of FIG. 6 in detail. FIG. 8 is a timing diagram illustrating an operation of the PD 100' of FIG. 7. In FIG. 7, for convenience sake, only a part of the PD 100' is illustrated for convenience sake. It will be understood that at least some example embodiments the inventive concepts applied to the illustrated component may be also applied to the remaining components (not shown). For FIG. 7, a difference between the PD 100 of FIG. 4 and the PD 100' of FIG. 7 will be mainly described.

Referring to FIG. 7, the PD 100' may include the sampling latch circuit 102, the edge detection circuit 104, and the pulse adjustment circuit 106. The pulse adjustment circuit 106 may include first and second pulse adjusters 106_1 and 106_2. According to at least some example embodiments, the first and second pulse adjustors 106_1 and 106_2 may each be implemented by a circuit or circuitry. The first and second pulse adjustors 106_1 and 106_2 may also be referred to, in the present specification, as first and second pulse adjustor circuits 106_1 and 106_2. The first pulse adjuster 106_1 may receive the first phase control signal UP from the first edge detector 104_1 and may receive the second sample signal S2 from the second sampling latch 102_2. The first pulse adjuster 106_1 may generate a first phase control signal UP' by adjusting a pulse width of the first phase control signal UP based on the second sample signal S2. The second pulse adjuster 106_2 may receive the second phase control signal DN from the second edge detector 104_2 and may receive the third sample signal S3 from the third sampling latch 102_3. The second pulse adjuster 106_2 may generate a second phase control signal DN' by adjusting a pulse width of the second phase control signal DN based on the third sample signal S3. The charge pump circuit 110 may receive the first and second phase control signals UP' and DN' and may perform a charge supply operation based on the first and second phase control signals UP' and DN'.

Hereinafter, referring to FIG. 8, operations of the first and second sampling latches 102_1 and 102_2, the first edge detector 104_1, and the first pulse adjuster 106_1 will be described in detail. It will be understood that, according to at least some example embodiments of the inventive concepts, the operations illustrated in FIG. 8 may be also applied to all the sampling latches, edge detectors, and pulse adjusters included in the PD 100'. On the other hand, the first and second sample signals S1 and S2 may respectively include the positive sample signals S1P and S2P and the negative sample signals S1N and S2N. In addition, hereinafter, a difference between FIG. 5 and FIG. 8 will be mainly described.

Referring to FIG. 8, the first edge detector 104_1 may reset the phase control signal and may fix the phase control signal to a low level in a first period (or a reset period) R between the first time t1 and the second time t2. Then, the first pulse adjuster 106_1 may set an output as a value of the phase control signal received from the first edge detector 104_1 in a second period (or a set period) S between the second time t2 and the fourth time t4 and may continuously output the set value by performing the hold operation in a third period (or a hold period) HOLD between the fourth time t4 and fifth time t5. That is, the first pulse adjuster 106_1 may increase a pulse width of a phase control signal UP'(0) by 'L' in comparison with the phase control signal UP(0) of FIG. 5. Until the recovery clock signal is generated, the first edge detector 104_1 and the first pulse adjuster 106_1 may periodically repeat operations in the first to third periods R, S, and HOLD. An internal signal INT_S generated by the first edge detector 104_1 will be described in detail in FIG. 11.

By the above method, at the fifth to eight times t5 to t8, a phase control signal UP'(1) may be generated by using the first sample signals S1P(1) and S1N(1), the second sample signals S2P(1) and S2N(1), and the first and second reference clock signals CLK_REF1 and CLK_REF2.

Figure 9:
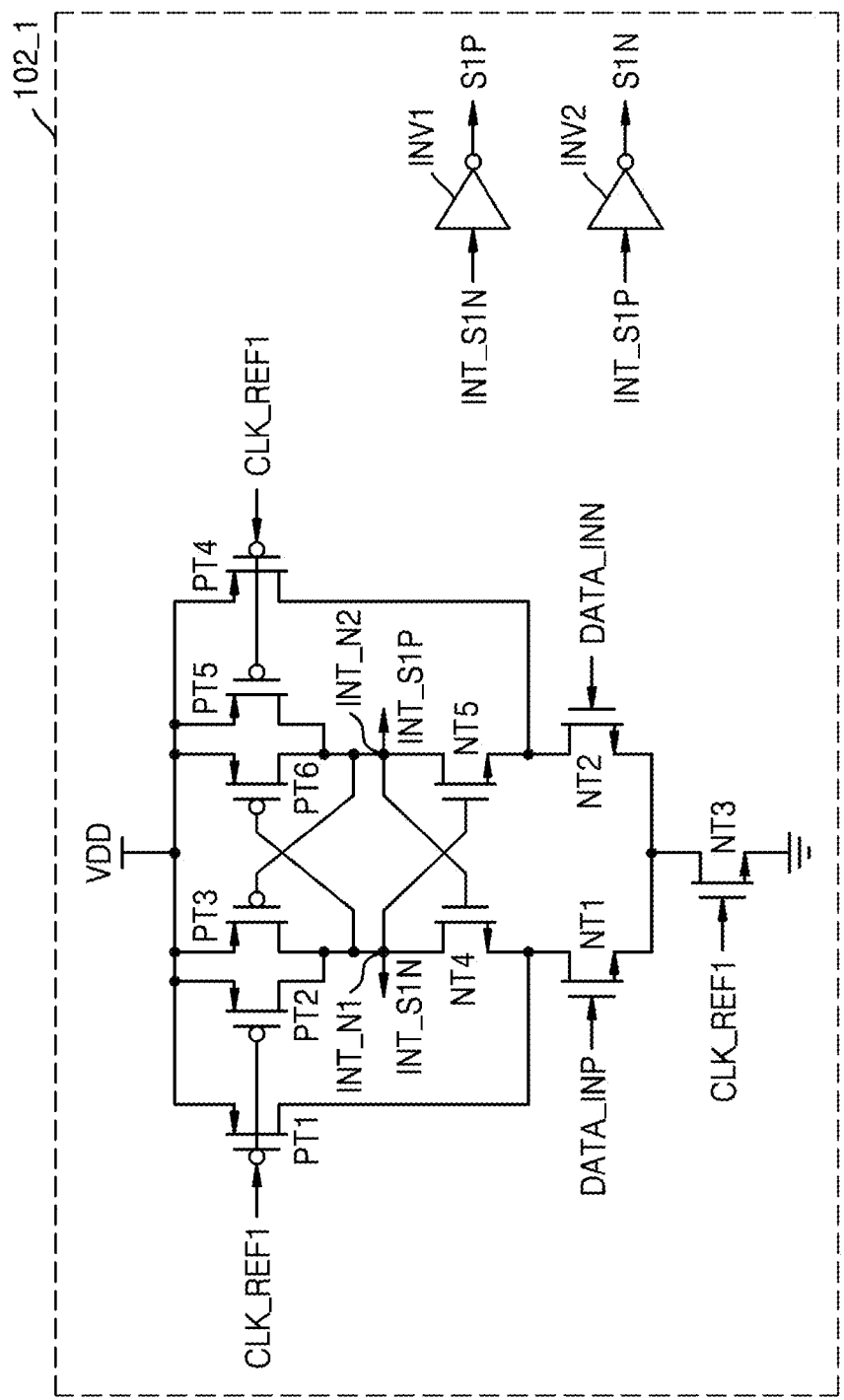
FIG. 9 is a view illustrating a detailed implementation example of a first sampling latch of FIG. 4 or 7.

FIG. 9 is a view illustrating a detailed implementation example of the first sampling latch 102_1 of FIG. 4 or 7. A configuration of the first sampling latch 102_1 of FIG. 9 may be also applied to other sampling latches.

Referring to FIG. 9, the first sampling latch 102_1 may include first to sixth PMOS transistors PT1 to PT6, first to fifth NMOS transistors NT1 to NT5, and first and second inverters INV1 and INV2. A source terminal of each of the first to sixth PMOS transistors PT1 to PT6 may be connected to a power voltage VDD. A drain terminal of the first PMOS transistor PT1 may be connected to a drain terminal of the first NMOS transistor NT1 and a source terminal of the fourth NMOS transistor NT4. Drain terminals of the second and third PMOS transistors PT2 and PT3 may be connected to a drain terminal of the fourth NMOS transistor NT4 through a first internal node INT_N1. A gate terminal of the fifth NMOS transistor NT5 may be further connected to the first internal node INT_N1. A drain terminal of the fourth PMOS transistor PT4 may be connected to a drain terminal of the second NMOS transistor NT2 and a source terminal of the fifth NMOS transistor NT5. Drain terminals of the fifth and sixth PMOS transistors PT5 and PT6 may be connected to a drain terminal of the fifth NMOS transistor NT5 through a second internal node INT_N2. A gate terminal of the fourth NMOS transistor NT4 may be further connected to the second internal node INT_N2. Source terminals of the first and second NMOS transistors NT1 and NT2 may be connected to a drain terminal of the third NMOS transistor NT3. A source terminal of the third NMOS transistor NT3 may be grounded.

The first reference clock signal CLK_REF1 may be input to gate terminals of the first, second, fourth, and fifth PMOS transistors PT1, PT2, PT4, and PT5 and a gate terminal of the third NMOS transistor NT3 and the positive input data signal DATA_INP may be input to a gate terminal of the first NMOS transistor NT1 and the negative input data signal DATA_INN may be input to a gate terminal of the second NMOS transistor NT2. As a result, a first negative internal sample signal INT_S1N may be output through the first internal node INT_N1 and a first positive internal sample signal INT_S1P may be output through the second internal node INT_N2.

The first inverter INV1 may receive the first negative internal sample signal INT_S1N, may invert the first negative internal sample signal INT_S1N, and may output a first positive sample signal S1P. The second inverter INV2 may receive the first positive internal sample signal INT_S1P, may invert the first positive internal sample signal INT_S1P, and may output a first negative sample signal S1N.

The first sampling latch 102_1 may output the first sample signals S1P and S1N generated by sampling the input data signal DATA_IN as illustrated in FIG. 5 or 8 in a high level period (for example, a period between the first time t1 and the third time t3 or a period between the fifth time t5 and the seventh time t7) of the first reference clock signal CLK_REF1.

An implementation example of the first sampling latch 102_1 of FIG. 9 is only an example. At least some example embodiments of the inventive concepts are not limited thereto, and the first sampling latch 102_1 may be variously implemented.

Figure 10:
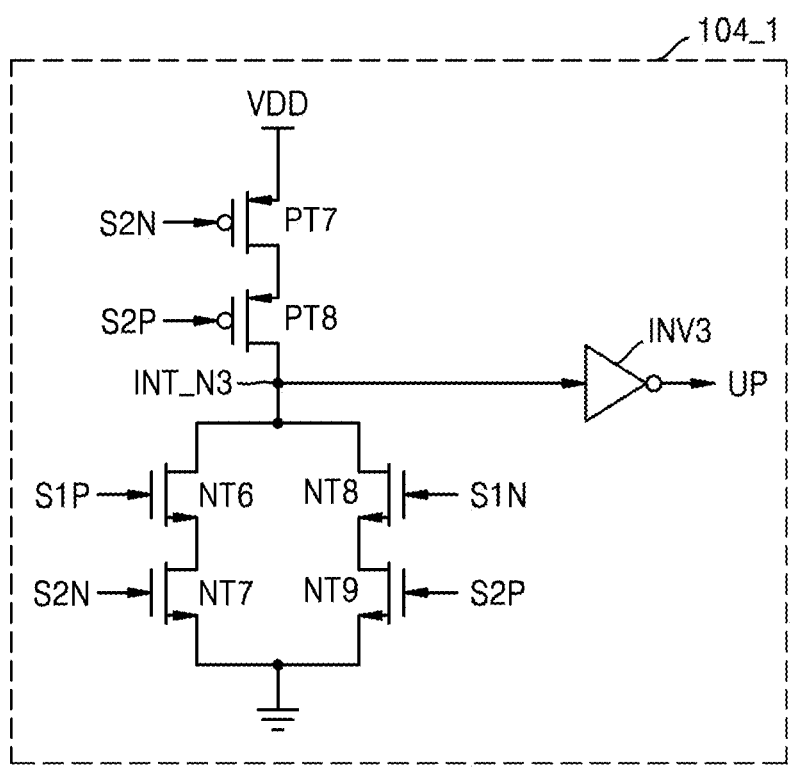
FIG. 10 is a view illustrating a detailed implementation example of a first edge detector of FIG. 4.

FIG. 10 is a view illustrating a detailed implementation example of the first edge detector 104_1 of FIG. 4. A configuration of the first edge detector 104_1 of FIG. 10 may be also applied to other edge detectors.

Referring to FIG. 10, the first edge detector 104_1 may include seventh and eighth PMOS transistors PT7 and PT8, sixth to ninth NMOS transistors NT6 to NT9, and a third inverter INV3. A source terminal of the seventh PMOS transistor PT7 may be connected to the power voltage VDD. A drain terminal of the seventh PMOS transistor PT7 may be connected to a source terminal of the eighth PMOS transistor PT8. A drain terminal of the eighth PMOS transistor PT8 may be connected to drain terminals of the sixth and eighth NMOS transistors NT6 and NT8 through a third internal node INT_N3. The sixth NMOS transistor NT6 may be connected to a drain terminal of the seventh NMOS transistor NT7 and a source terminal of the eighth NMOS transistor NT8 may be connected to a drain terminal of the ninth NMOS transistor NT9. Source terminals of the seventh and ninth NMOS transistors NT7 and NT9 may be grounded.

Each of gate terminals of the eighth PMOS transistor PT8 and the ninth NMOS transistor NT9 may receive a second positive sample signal S2P, and each of gate terminals of the seventh PMOS transistor PT7 and the seventh NMOS transistor NT7 may receive a second negative sample signal S2N. In addition, a gate terminal of the sixth NMOS transistor NT6 may receive the first positive sample signal S1P and a gate terminal of the eighth NMOS transistor NT8 may receive the first negative sample signal S1N. The third inverter INV3 may generate the first phase control signal UP by inverting a signal output from the third internal node INT_N3.

The implementation example of the first edge detector 104_1 of FIG. 10 is only an example, and at least some example embodiments of the inventive concepts are not limited thereto and may be variously implemented.

Figure 11:
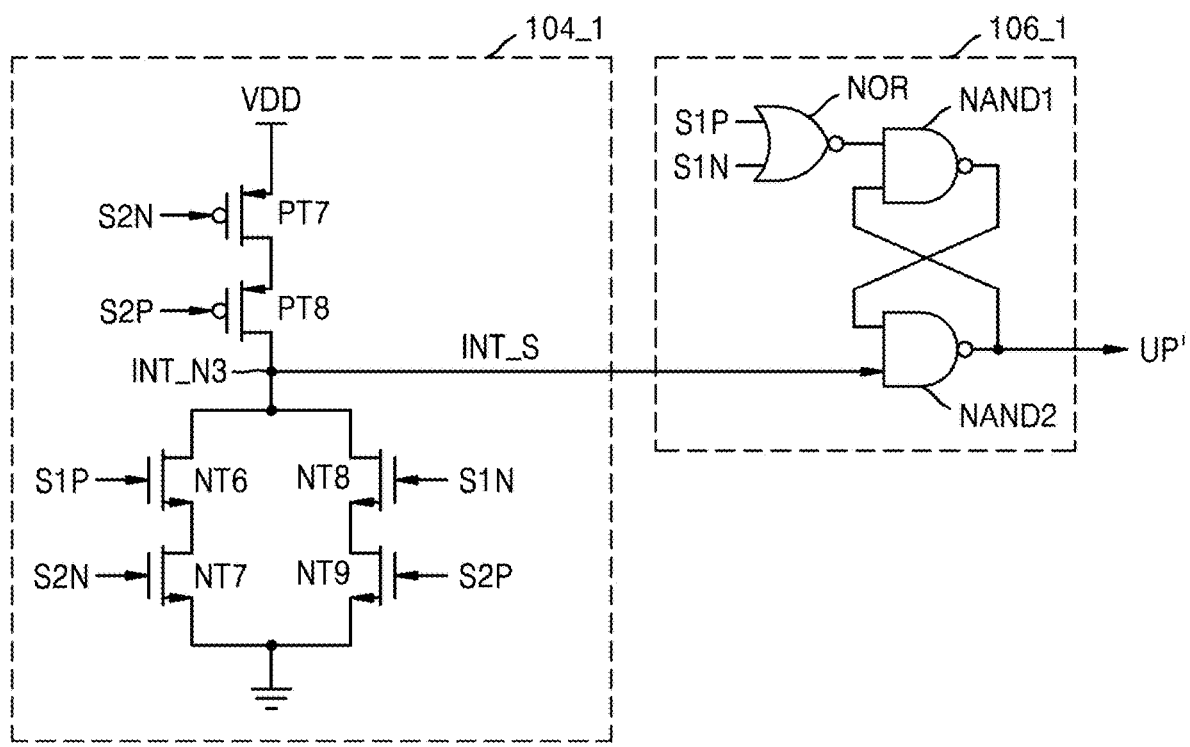
FIG. 11 is a view illustrating a detailed implementation example of the first edge detector and a first pulse adjuster of FIG. 7.

FIG. 11 is a view illustrating a detailed implementation example of the first edge detector 104_1 and the first pulse adjuster 106_1 of FIG. 7. Configurations of the first edge detector 104_1 and the first pulse adjuster 106_1 of FIG. 11 may be also applied to other edge detectors and pulse adjusters.

Referring to FIG. 11, the first edge detector 104_1 may include the seventh and eighth PMOS transistors PT7 and PT8, the sixth to ninth NMOS transistors NT6 to NT9, and the third inverter INV3. The source terminal of the seventh PMOS transistor PT7 may be connected to the power voltage VDD The drain terminal of the seventh PMOS transistor PT7 may be connected to the source terminal of the eighth PMOS transistor PT8. The drain terminal of the eighth PMOS transistor PT8 may be connected to the drain terminals of the sixth and eighth NMOS transistors NT6 and NT8 through the third internal node INT_N3. The source terminal of the NMOS transistor NT6 may be connected to the drain terminal of the seventh NMOS transistor NT7, and the source terminal of the eighth NMOS transistor NT8 may be connected to the drain terminal of the ninth NMOS transistor NT9. The first pulse adjuster 106_1 may include a NOR circuit NOR and first and second NAND circuits NAND1 and NAND2. The first and second NAND circuits NAND1 and NAND2 may be referred to as R/S latches.

Each of the gate terminals of the eighth PMOS transistor PT8 and the ninth NMOS transistor NT9 may receive the second positive sample signal S2P, and each of the gate terminals of the seventh PMOS transistor PT7 and the seventh NMOS transistor NT7 may receive the second negative sample signal S2N. In addition, the gate terminal of the sixth NMOS transistor NT6 may receive the first positive sample signal S1P, and the gate terminal of the eighth NMOS transistor NT8 may receive the first negative sample signal S1N. The first positive sample signal S1P and the first negative sample signal S1N are input to the NOR circuit NOR, and an output signal of the NOR circuit NOR may be input to the first NAND circuit NAND1. An output signal of the second NAND circuit NAND2 may be further input to the first NAND circuit NAND1. The internal signal INT_S may be input from the internal node INT_N3 of the first phase detector 104_1 to the second NAND circuit NAND2 and an output signal of the first NAND circuit NAND1 may be input to the second NAND circuit NAND2. Therefore, the first pulse adjuster 106_1 may output the first phase control signal UP' with an adjusted pulse width.

Hereinafter, operations of the first edge detector 104_1 and the first pulse adjuster 106_1 of FIG. 11 will be described with reference to FIG. 8.

In a first period R, the second negative sample signal S2N at a low level and the second positive sample signal S2P at a low level may be respectively input to the seventh PMOS transistor PT7 and the eighth PMOS transistor PT8 of the first edge detector 104_1 so that the internal signal INT_S may be reset to be at a high level and the internal signal INT_S fixed to the high level may be output to the first pulse adjuster 106_1. Therefore, the first phase control signal UP' may be fixed to a low level and may be output in the first period R.

In a second period S, the second negative sample signal S2N at the low level may be input to the seventh PMOS transistor PT7 of the first edge detector 104_1 and the second positive sample signal S2P at a high level may be input to the eighth PMOS transistor PT8. Therefore, the internal node INT_N3 may not be connected to the power voltage VDD and may be ground in accordance with levels of the first sample signals S1P and S1N and the second sample signals S2P and S2N. That is, in the second period S, the first edge detector 104_1 may compare the first sample signals S1P and S1N with the second sample signals S2P and S2N by performing an XNOR comparison operation via the sixth to ninth NMOS transistors NT6 to NT9. The first positive sample signal S1P at a high level and the first negative sample signal S1N at a low level may be input to the NOR circuit NOR of the first pulse adjuster 106_1, and the first pulse adjuster 106_1 may invert the internal signal INT_S generated as a result of performing the operation and may output the inverted internal signal INT_S as the first phase control signal UP'.

In a third period HOLD, as the first positive sample signal S1P at a low level and the first negative sample signal S1N at the low level are input to the NOR circuit NOR of the first pulse adjuster 106_1, the first pulse adjuster 106_1 may continuously output the first phase control signal UP' at the same level as that of the first phase control signal UP' output in the second period S.

Then, in a period R between the fifth time t5 and sixth time t6, the second negative sample signal S2N at the low level and the second positive sample signal S2P at the low level may be respectively input to the seventh PMOS transistor PT7 and the eighth PMOS transistor PT8 of the first edge detector 104_1 again so that the first phase control signal UP' may be reset and may be fixed to the low level.

Figure 12:
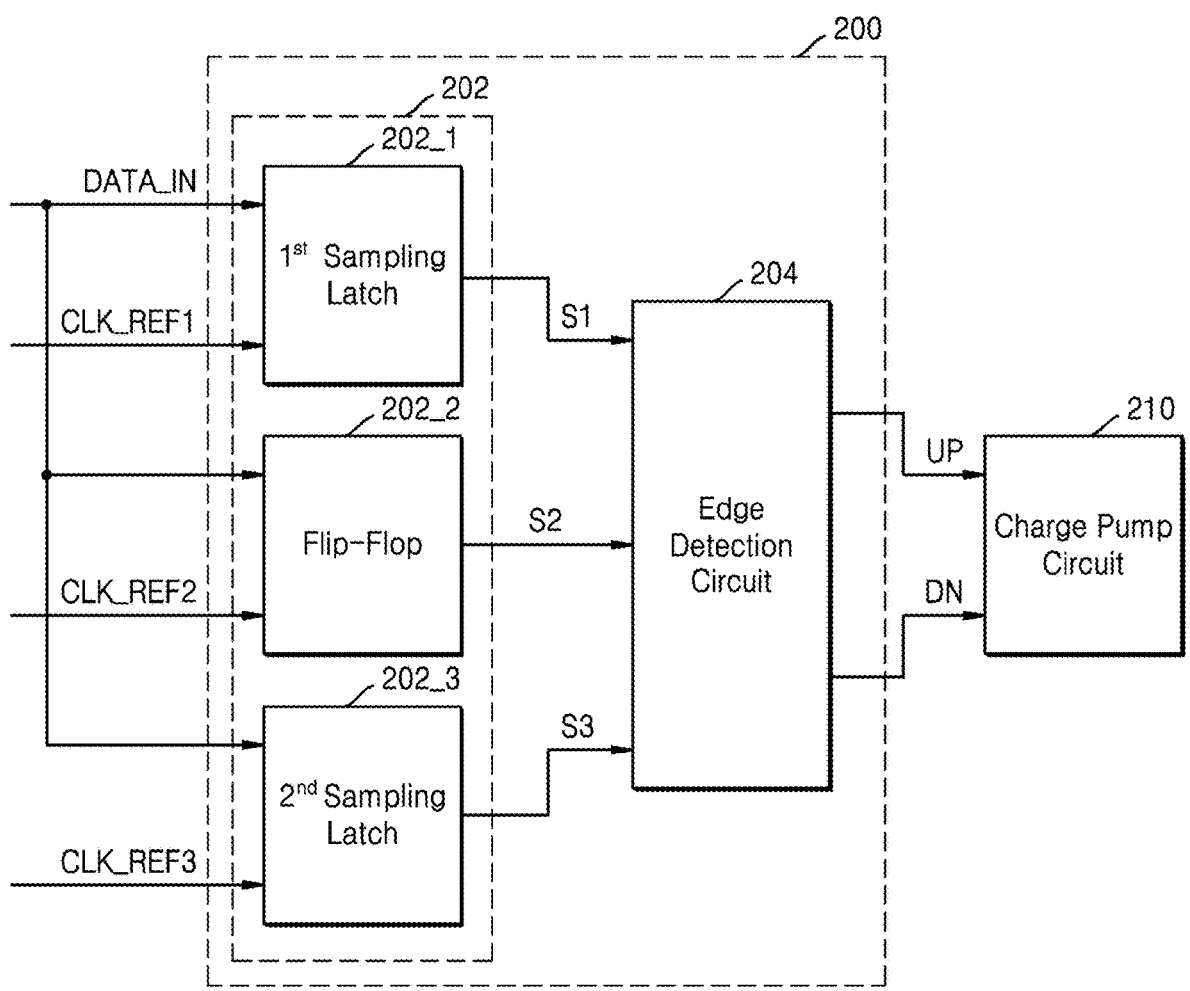
FIG. 12 is a block diagram illustrating a PD according to at least some example embodiments of the inventive concepts in detail.

FIG. 12 is a block diagram illustrating a PD 200 according to at least some example embodiments of the inventive concepts in detail.

Referring to FIG. 12, the PD 200 may include a sampling circuit 202 and an edge detection circuit 204. The sampling circuit 202 may include a first sampling latch 202_1, a flip-flop 202_2, and a second sampling latch 202_3. The first sampling latch 202_1 may receive the input data signal DATA_IN and the first reference clock signal CLK_REF1 and may generate the first sample signal S1 by sampling the input data signal DATA_IN at the edge of the first reference clock signal CLK_REF1. The flip-flop 202_2 may receive the input data signal DATA_IN and the second reference clock signal CLK_REF2 and may generate the second sample signal S2 by sampling the input data signal DATA_IN at the edge of the second reference clock signal CLK_REF2. The second sampling latch 202_3 may receive the input data signal DATA_IN and the third reference clock signal CLK_REF3 and may generate the third sample signal S3 by sampling the input data signal DATA_IN at the edge of the third reference clock signal CLK_REF3. The PD 200 may also be referred to, in the present specification, as the PD circuit 200.

According to at least one example embodiment of the inventive concepts, the flip-flop 202_2 may further include a component to be compared with the first and second sampling latches 202_1 and 202_2 and to hold a value of the second sample signal S2 in a certain period, which will be described in detail with reference to FIG. 13.

The edge detection circuit 204 may receive the first to third sample signals S1 to S3 and may generate the first and second phase control signals UP and DN by comparing the first sample signal S1 with the second sample signal S2 and comparing the second sample signal S2 with the third sample signal S3. The edge detection circuit 204 may generate the first and second phase control signals UP and DN with the prevented garbage pulse like in the above-described other embodiments. The edge detection circuit 204 may provide the first and second phase control signals UP and DN to the charge pump circuit 210, and the charge pump circuit 210 may perform a charge supply operation, based on the first and second phase control signals UP and DN.

Figure 13:
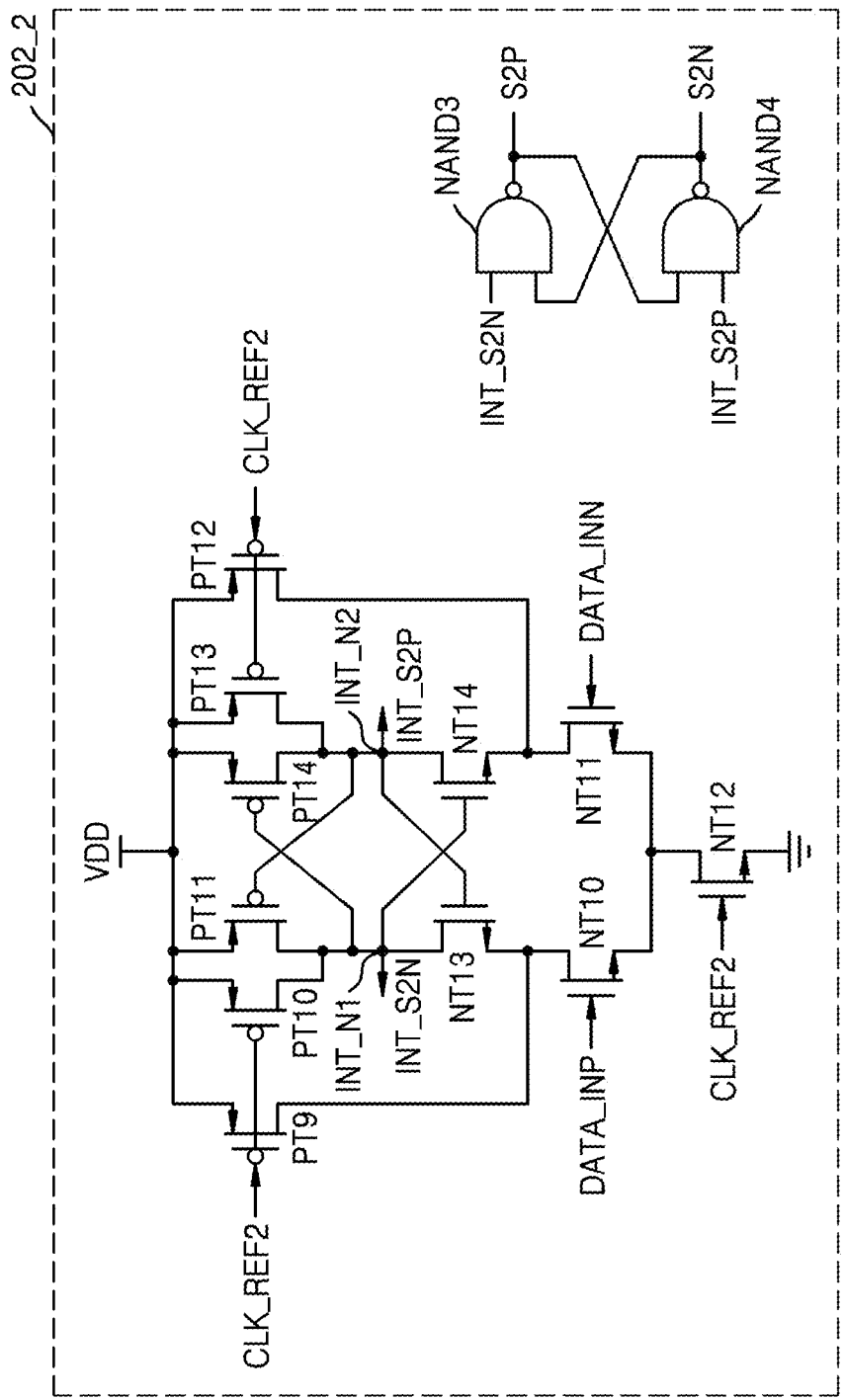
FIG. 13 is a view illustrating a detailed implementation example of a flip-flop of FIG. 12.

FIG. 13 is a view illustrating a detailed implementation example of the flip-flop 202_2 of FIG. 12.

Referring to FIG. 13, the flip-flop 202_2 may include ninth to 14$^{th}$ PMOS transistors PT9 to PT14, tenth to 14$^{th}$ NMOS transistors NT10 to NT14, and third and fourth NAND circuits NAND3 and NAND4. A source terminal of each of the ninth to 14$^{th}$ PMOS transistors PT9 to PT14 may be connected the power voltage VDD. A drain terminal of the ninth PMOS transistor PT9 may be connected to a drain terminal of the tenth NMOS transistor NT10 and a source terminal of the 13$^{th}$ NMOS transistor NT13. Drain terminals of the tenth and 11$^{th}$ PMOS transistors PT10 and PT11 may be connected to a drain terminal of the 13$^{th}$ NMOS transistor NT13 through the first internal node INT_N1. A gate terminal of the 14$^{th}$ NMOS transistor NT14 may be further connected to the first internal node INT_N1. A drain terminal of the 12$^{th}$ PMOS transistor PT12 may be connected to a drain terminal of the 11$^{th}$ NMOS transistor NT11 and a source terminal of the 14$^{th}$ NMOS transistor NT14. Drain terminals of the 13$^{th}$ and 14$^{th}$ PMOS transistors PT13 and PT14 may be connected to a drain terminal of the 14$^{th}$ NMOS transistor NT14 through the second internal node INT_N2. A gate terminal of the 13$^{th}$ NMOS transistor NT13 may be further connected to the second internal node INT_N2. Source terminals of the tenth and 11$^{th}$ NMOS transistors NT10 and NT11 may be connected to a drain terminal of the 12$^{th}$ NMOS transistor NT12. A source terminal of the 12$^{th}$ NMOS transistor NT12 may be grounded.

The second reference clock signal CLK_REF2 may be input to each of gate terminals of the ninth, tenth, 12$^{th}$, and 13$^{th}$ PMOS transistors PT9, PT10, PT12, and PT13 and a gate terminal of the 12$^{th}$ NMOS transistor NT12, the positive input data signal DATA_INP may be input to a gate terminal of the tenth NMOS transistor NT10, and the negative input data signal DATA_INN may be input to a gate terminal of the 11$^{th}$ NMOS transistor NT11. As a result, a second negative internal sample signal INT_S2N may be output through the first internal node INT_N1 and a second positive internal sample signal INT_S2P may be output through the second internal node INT_N2.

A third NAND circuit NAND3 may receive the second negative internal sample signal INT_S2N and the second negative sample signal S2N that is an output of a fourth NAND circuit NAND4 and may output the second positive sample signal S2P. The fourth NAND circuit NAND4 may receive the second positive internal sample signal INT_S2P and the second positive sample signal S2P that is an output of the third NAND circuit NAND3 and may output the second negative sample signal S2N. Values of the second positive sample signal S2P and the second negative sample signal S2N may be held by the third NAND circuit NAND3 and the fourth NAND circuit NAND4 in a certain period. On the other hand, each of the first and second sampling latches 202_1 and 202_3 of FIG. 12 may be implemented to have the structure illustrated in FIG. 9.

Because the implementation example of the flip-flop 202_2 illustrated in FIG. 13 is only an example, at least some example embodiments of the inventive concepts are not limited thereto, and the flip-flop 202_2 may be implemented by one of various components that may perform operations according to at least some example embodiments of the inventive concepts.

Figure 14:
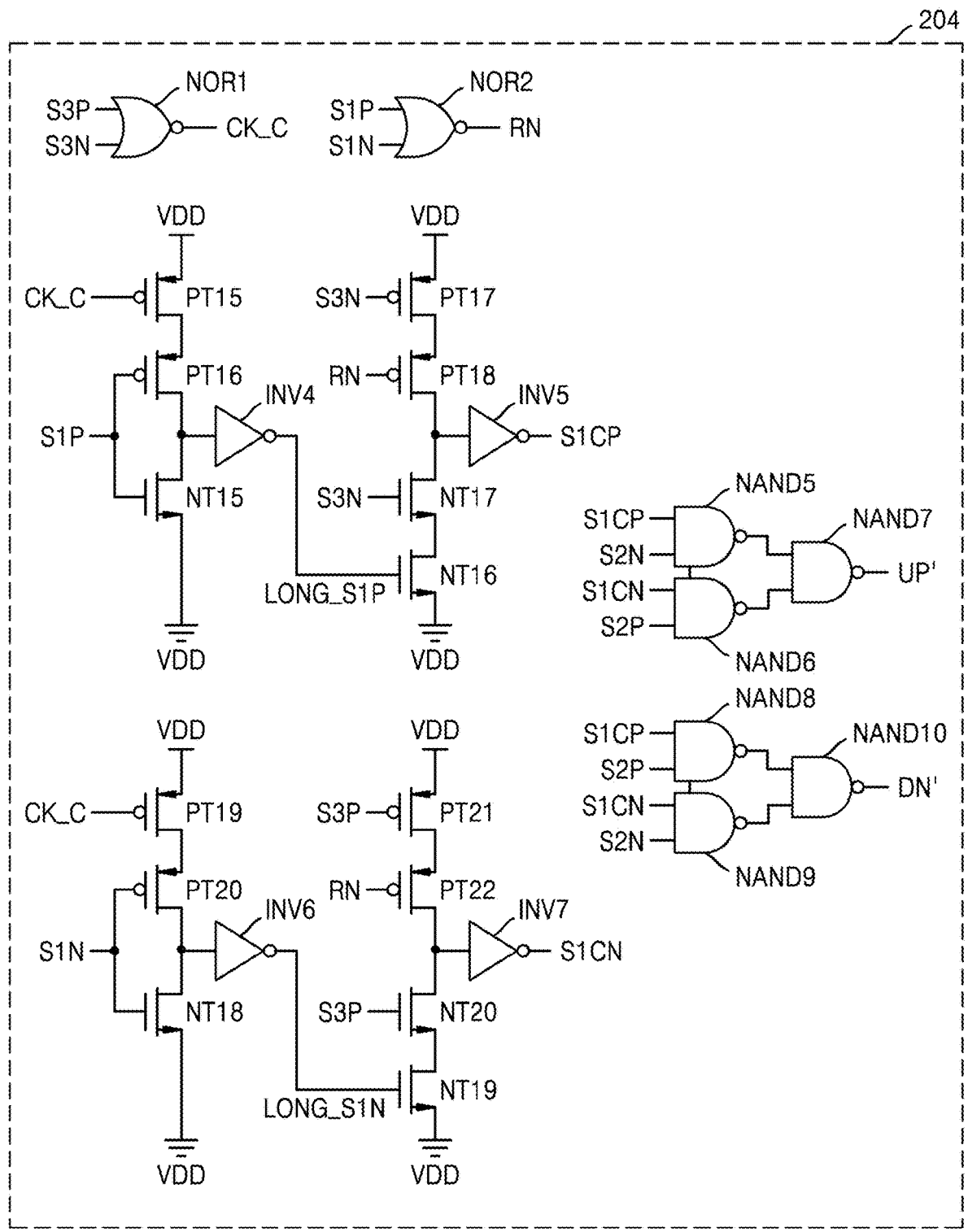
FIG. 14 is a view illustrating a detailed implementation example of an edge detection circuit of FIG. 12.
Figure 15:
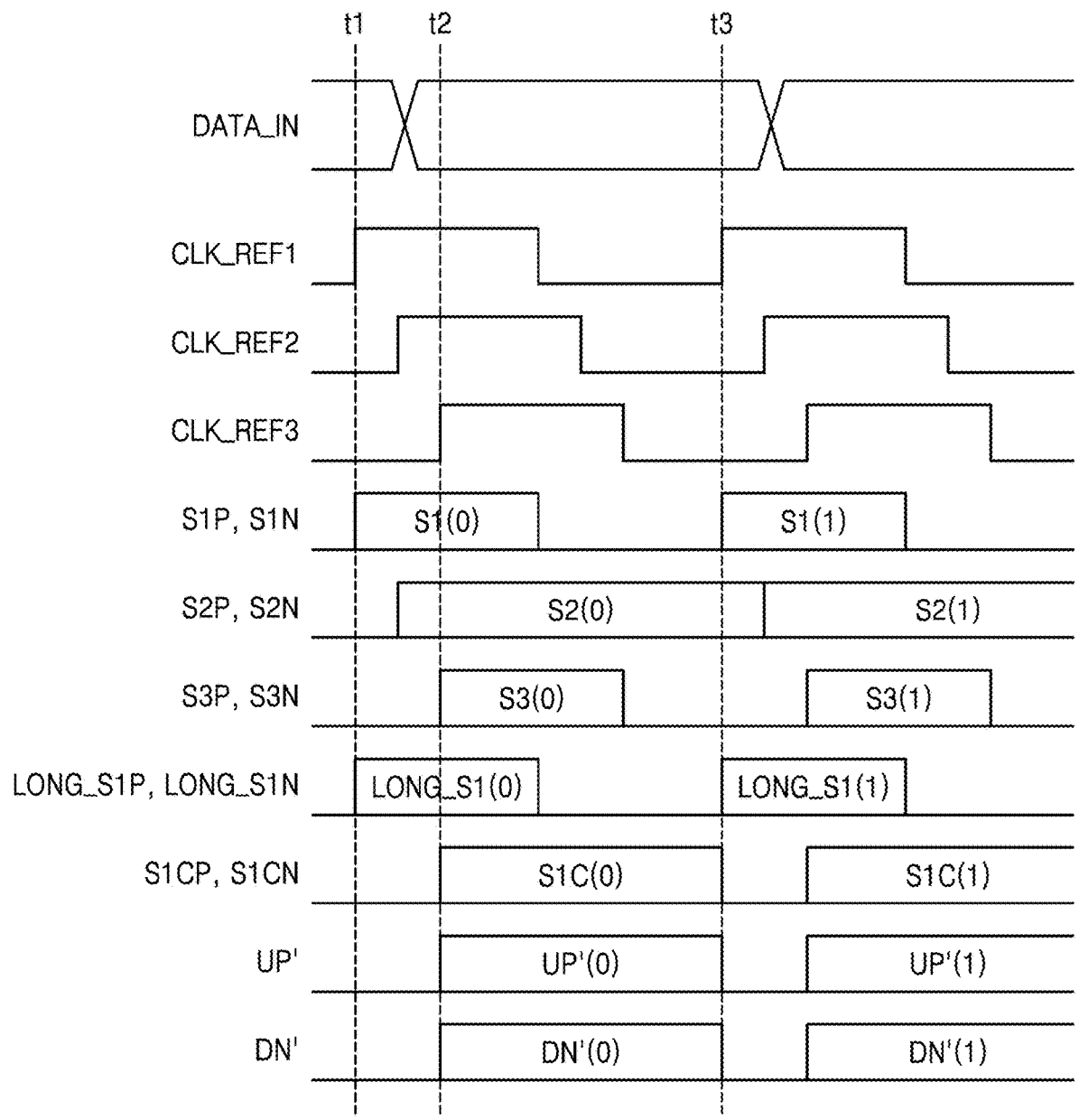
FIG. 15 is a timing diagram illustrating an operation of the edge detection circuit of FIG. 14.

FIG. 14 is a view illustrating a detailed implementation example of the edge detection circuit 204 of FIG. 12. FIG. 15 is a timing diagram illustrating an operation of the edge detection circuit 204 of FIG. 14.

Referring to FIG. 14, the edge detection circuit 204 may include $15^{th}$ to $22^{nd}$ PMOS transistors PT15 to PT22, $15^{th}$ to $20^{th}$ NMOS transistors NT15 to NT20, first and second NOR circuits NOR1 and NOR2, fourth to seventh inverters INV4 to INV7, and fifth to tenth NAND circuits NAND5 to NAND10.

The first NOR circuit NOR1 may receive a third positive sample signal S3P and a third negative sample signal S3N and may generate a first internal signal CK_C. The second NOR circuit NOR2 may receive the first positive sample signal S1P and the first negative sample signal S1N and may generate a second internal signal RN.

Each of source terminals of the $15^{th}$, $17^{th}$, $19^{th}$, and $21^{st}$ PMOS transistors PT15, PT17, PT19, and PT21 may be connected to the power voltage VDD. Source terminals of the $15^{th}$, $16^{th}$, $18^{th}$, and $19^{th}$ NMOS transistors NT15, NT16, NT18, and NT19 may be grounded.

A drain terminal of the $15^{th}$ PMOS transistor PT15 may be connected to a source terminal of the $16^{th}$ PMOS transistor PT16. A drain terminal of the $16^{th}$ PMOS transistor PT16 may be connected to a drain terminal of the $15^{th}$ NMOS transistor NT15. A drain terminal of the $17^{th}$ PMOS transistor PT17 may be connected to a source terminal of the $18^{th}$ PMOS transistor PT18. A drain terminal of the $18^{th}$ PMOS transistor PT18 may be connected to a drain terminal of the $17^{th}$ NMOS transistor NT17. A source terminal of the $17^{th}$ NMOS transistor NT17 may be connected to a drain terminal of the $16^{th}$ NMOS transistor NT16. A drain terminal of the $19^{th}$ PMOS transistor PT19 may be connected to a source terminal of the $20^{th}$ PMOS transistor PT20. A drain terminal of the $20^{th}$ PMOS transistor PT20 may be connected to a drain terminal of the $18^{th}$ NMOS transistor NT18. A drain terminal of the $21^{st}$ PMOS transistor PT21 may be connected to a source terminal of the $22^{nd}$ PMOS transistor PT22. A drain terminal of the $22^{nd}$ PMOS transistor PT22 may be connected to a drain terminal of the $20^{th}$ NMOS transistor NT20. A source terminal of the $20^{th}$ NMOS transistor NT20 may be connected to a drain terminal of the $19^{th}$ NMOS transistor NT19.

An input stage of a fourth inverter INV4 may be connected to a node between the $16^{th}$ PMOS transistor PT16 and the $15^{th}$ NMOS transistor NT15 and an output stage of the fourth inverter INV4 may be connected to a gate terminal of the $16^{th}$ NMOS transistor NT16. An input stage of a fifth inverter INV5 may be connected to a node between the $18^{th}$ PMOS transistor PT18 and the $17^{th}$ NMOS transistor NT17. An input stage of a sixth inverter INV6 may be connected to a node between the $20^{th}$ PMOS transistor PT20 and the $18^{th}$ NMOS transistor NT18, and an output stage of the sixth inverter INV6 may be connected to a gate terminal of the $19^{th}$ NMOS transistor NT19. An input stage of a seventh inverter INV7 may be connected to a node between the $22^{nd}$ PMOS transistor PT22 and the $20^{th}$ NMOS transistor NT20.

The first internal signal CK_C may be input to gate terminals of the $15^{th}$ and $19^{th}$ PMOS transistors PT15 and PT19, and the second internal signal RN may be input to gate terminals of the $18^{th}$ and $22^{nd}$ PMOS transistors PT18 and PT22. The first positive sample signal S1P may be input to gate terminals of the $16^{th}$ PMOS transistor PT16 and the $15^{th}$ NMOS transistor NT15, and the first negative sample signal S1N may be input to gate terminals of the $20^{th}$ PMOS transistor PT20 and the $18^{th}$ NMOS transistor NT18. The third negative sample signal S3N may be input to gate terminals of the $17^{th}$ PMOS transistor PT17 and the $17^{th}$ NMOS transistor NT17, and the third positive sample signal S3P may be input to the $21^{st}$ PMOS transistor PT21 and the $20^{th}$ NMOS transistor NT20. The fourth inverter INV4 may output a first positive long signal LONG_S1P to the gate terminal of the $16^{th}$ NMOS transistor NT16, and the sixth inverter INV6 may output a first negative long signal LONG_S1N to the gate terminal of the $19^{th}$ NMOS transistor NT19. The fifth inverter INV5 may output a first modified positive sample signal S1CP, and the seventh inverter INV7 may output a first modified negative sample signal S1CN.

A fifth NAND circuit NAND5 may receive the first modified positive sample signal S1CP and the second negative sample signal S2N, and a sixth NAND circuit NAND6 may receive the first modified negative sample signal S1CN and the second positive sample signal S2P. A seventh NAND circuit NAND7 may receive outputs of the fifth and sixth NAND circuits NAND5 and NAND6 and may output the first phase control signal UP'. An eighth NAND circuit NAND8 may receive the first modified positive sample signal S1CP and the second positive sample signal S2P, and a ninth NAND circuit NAND9 may receive the first modified negative sample signal S1CN and the second negative sample signal S2N. A tenth NAND circuit NAND10 may receive outputs of the eighth and ninth NAND circuits NAND8 and NAND9 and may output the second phase control signal DN'.

Further referring to FIG. 15, the edge detection circuit 204 may generate first long signals LONG_S1P(0) and LONG_S1N(0) by using the first sample signals S1P(0) and S1N(0) and third sample signals S3P(0) and S3N(0). The first long signals LONG_S1P(0) and LONG_S1N(0) may be generated together with the first sample signals S1P(0) and S1N(0) from the first time t1. The first sample signals S1P(0) and S1N(0) may have pulse widths equal or similar to those of the first reference clock signal CLK_REF1 and the first long signals LONG_S1P(0) and LONG_S1N(0). The third sample signals S3P(0) and S3N(0) may be generated from the second time t2 and may have pulse widths equal or similar to that of the third reference clock signal CLK_REF3. The second sample signals S2P(0) and S2N(0) may be generated from a prescribed point in time between the first time t1 and the second time t2 and may have pulse widths greater than those of the first sample signals S1P(0) and S1N(0) and the third sample signals S3P(0) and S3N(0).

The edge detection circuit 204 may generate first modified sample signals S1CP(0) and S1CN(0) by using the first long signals LONG_S1P(0) and LONG_S1N(0) and the third sample signals S3P(0) and S3N(0). The first modified sample signals S1CP(0) and S1CN(0) may be generated from the second time t2 and may be maintained until the third time t3 at which the first sample signals S1P(1) and S1N(1) are generated. The edge detection circuit 204 may generate the first and second phase control signals UP' and DN' by using the first modified sample signals S1CP(0) and S1CN(0) and the second sample signals S2P(0) and S2N(0) and the first modified sample signals S1CP(0) and S1CN(0) may have widths equal to those of the first and second phase control signals UP' and DN'. The edge detection circuit 204 may prevent the garbage pulse from being generated by having the first and second phase control signals UP' and DN' generated from the second time t2 at which the first to third sample signals S1P(0), S1N(0), S2P(0), S2N(0), S3P(0), and S3N(0) overlap.

Figure 16:
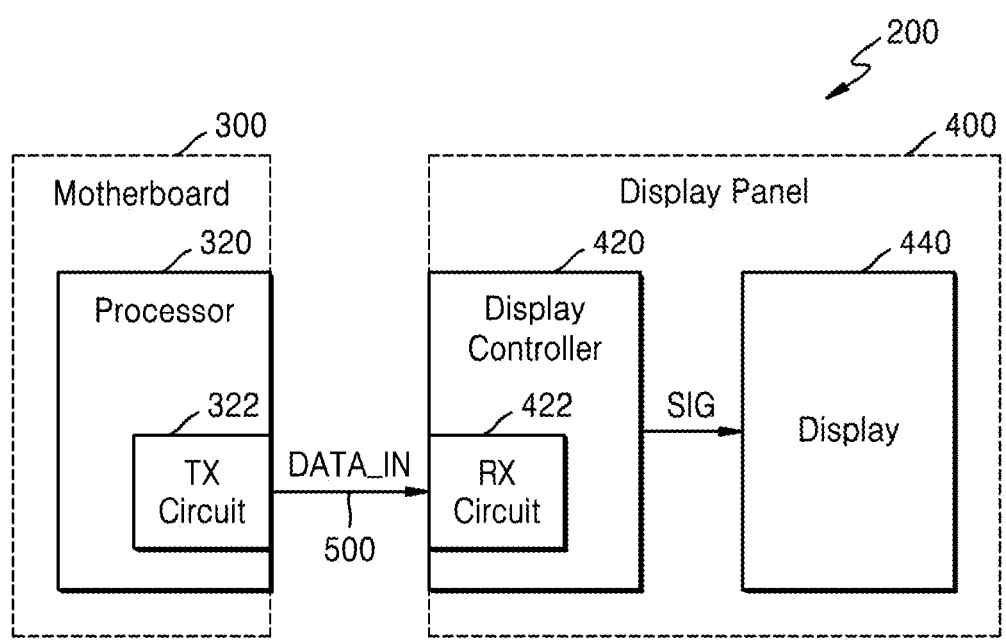
FIG. 16 is a block diagram illustrating an apparatus including a clock data recovery circuit according to at least some example embodiments of the inventive concepts.

FIG. 16 is a block diagram illustrating an apparatus 200 including a clock data recovery circuit according to at least some example embodiments of the inventive concepts.

The clock data recovery circuit according to at least one example embodiment of the inventive concepts may be included in a receiving circuit 422. The apparatus 200 may be a computing system including a display panel 400 or, as a non-limiting example, a stationary system such as a desktop computer, a server, a TV, or an electronic display or a mobile system such as a laptop computer, a mobile phone, a tablet PC, or a wearable device. As illustrated in FIG. 12, the apparatus 200 may include a mother board 300 and the display panel 400 and the input data signal DATA_IN may be transmitted from the mother board 300 to the display panel 400 through a data line 500.

The mother board 300 may include a processor 320 and the processor 320 may include a transmission circuit 322. The processor 320 may refer to a processing unit performing a computational operation such as a microcontroller, an application specific integrated circuit (ASIC) or a field programmable gate array (FPGA). In some embodiments, the processor 320 may be a video graphic processor such as a graphic processing unit (GPU). The processor 320 may generate image data corresponding to an image output through a display 440 included in the display panel 400 and may provide the image data to the transmission circuit 322.

The transmission circuit 322 may receive the image data and may generate the input data signal DATA_IN by converting the image data into serial data. For example, the transmission circuit 322 may generate the input data signal DATA_IN so that pixel data corresponding to one pixel of the display 440 corresponds to one packet. As described above with reference to FIG. 1, the input data signal DATA_IN may include an embedded clock signal.

The display panel 400 may include a display controller 420 and the display 440. The display controller 420 may receive the input data signal DATA_IN including the serial data from the mother board 300 and may provide a display signal SIG to the display 440 by processing the input data signal DATA_IN. In some embodiments, the display controller 420 may provide the display signal SIG for controlling pixels included in the display 440 and may be referred to as a display driver integrated circuit (DDI).

The display controller 420 may include the receiving circuit 422 and the receiving circuit 422 may receive the input data signal DATA_IN. The receiving circuit 422 may include the clock data recovery circuit according to at least some example embodiments of the inventive concepts and may recover a clock signal and data from the input data signal DATA_IN. As resolution of the display 440 increases and the number of images updated by the display 440, that is, a frame rate increases, an amount of data transmitted from the mother board 300 to the display panel 400 may remarkably increase.

As described above, according to at least some example embodiments of the inventive concepts, the clock data recovery circuit included in the receiving circuit 422 may prevent the garbage pulse from being generated when an operation of recovering the input data signal DATA_IN is performed and may increase a pulse of a signal required for a correct recovery operation.

The display 400 may include an arbitrary type of display such as a liquid crystal display (LCD), a light emitting diode (LED), an electroluminescent display (ELD), a cathode ray tube (CRT), a plasma display panel (PDP), or a liquid crystal on silicon (LCoS) as a non-limiting example. In addition, in FIG. 12, the apparatus 200 is illustrated as including one display panel 400. However, in some embodiments, the apparatus 200 may include no less than two display panels, that is, no less than two displays.

Figure 17:
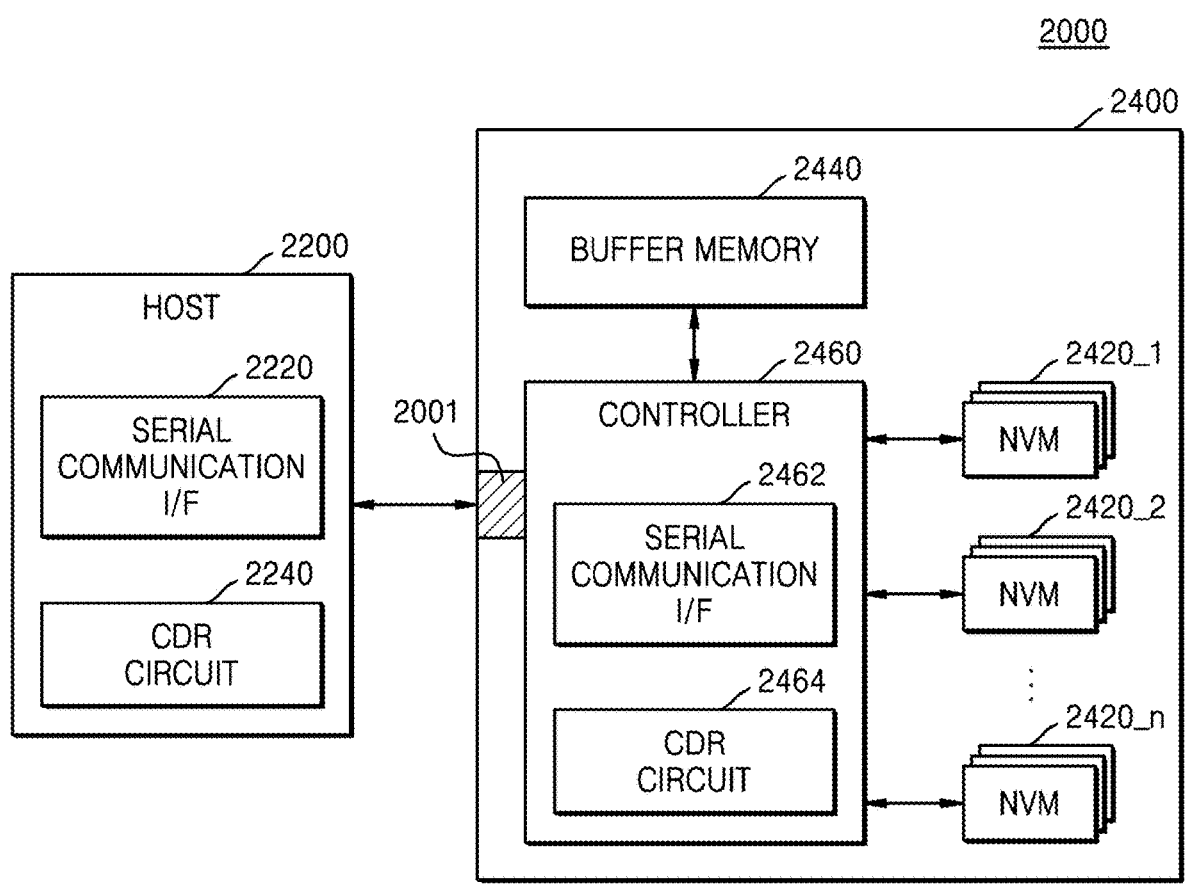
FIG. 17 is a block diagram illustrating a system including a clock data recovery circuit according to at least some example embodiments of the inventive concepts.

FIG. 17 is a block diagram illustrating a system 2000 including clock data recovery circuits 2240 and 2464 according to at least some example embodiments of the inventive concepts.

Referring to FIG. 17, the system 2000 may include a host 2200 and a storage device 2400. The storage device 2400 may be referred to as a memory system or a storage system and may include a signal connector 2001, a plurality of non-volatile memories 2420_1 to 2420_n, a buffer memory 2440, and a controller 2460. For example, the controller 2460 may be referred to as a memory controller or a storage controller.

The storage device 2400 may transmit and receive a signal to and from the host 2200 through the signal connector 2001. The host 2200 and the storage device 2400 may communicate through an electrical signal and/or an optical signal and, as a non-limiting example, may communicate through a universal flash storage (UFS), a serial advanced technology attachment (SATA), an SATA express (SATAe), a small computer small interface (SCSI), a serial attached SCSI (SAS), a peripheral component interconnect express (PCIe), a non-volatile memory express (NVMe), an advanced host controller interface (AHCI), or a combination of the above units.

The controller 2460 may control the plurality of non-volatile memories 2420_1 to 2420_n in response to the signal received from the host 2200. The controller 2460 may include a serial communication interface circuit 2462 for data transmission and reception and may include the clock data recovery circuit 2464 to which at least some example embodiments of the inventive concepts may be applied in order to recover a clock signal and data of a received serial data signal. The serial communication interface circuit 2462 may provide a communication interface such as the UFS, the SATA, the SATAe, the SCSI, the SAS, the PCIe, the NVMe, or the AHCI. The buffer memory 2440 may operate as buffer memory of the storage device 2400. On the other hand, the host 2200 may also include the serial communication interface circuit 2220 for transmitting and receiving data and the clock data recovery circuit 2240 to which at least some example embodiments of the inventive concepts may be applied.

Each of the non-volatile memories 2420_1 to 2420_n may include a memory cell array. The memory cell array may include memory blocks. Each of the memory blocks may be divided into pages. Each of the pages may include non-volatile memory cells, for example, at least one NAND flash memory cell.

Any of the elements disclosed above and illustrated in FIGS. 1-17 may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While at least some example embodiments of the inventive concepts have been particularly shown and described with reference to embodiments thereof, it will be understood that various changes in form and details may be made therein without departing from the spirit and scope of the following claims.

What is claimed is:

1. A clock data recovery circuit configured to receive an input data signal including an embedded clock signal, the clock data recovery circuit comprising:
   a clock recovery circuit including a phase detector configured to detect a phase of the embedded clock signal and to generate a recovery clock signal from the input data signal based on the detected phase; and
   a data recovery circuit configured to generate a recovery data signal from the input data signal by using the recovery clock signal,
   wherein the phase detector circuit comprises:
      a sampling latch circuit configured to output a first sample signal from the input data signal at a first edge of a first reference clock signal in a period from the first edge of the first reference clock signal to a second edge of the first reference clock signal and output a second sample signal from the input data signal at a first edge of a second reference clock signal having a predetermined phase difference from the first reference clock signal in a period from the first edge of the second reference clock signal to a second edge of the second reference clock signal; and
      an edge detection circuit configured to generate a phase control signal based on the first sample signal and the second sample signal and output the phase control signal in a period in which the second sample signal is output from the sampling latch circuit.

2. The clock data recovery circuit of claim 1, wherein the edge detection circuit is configured to,
   reset the phase control signal from a point in time at which the first sample signal starts to be output from the sampling latch circuit to a point in time at which the second sample signal starts to be output from the sampling latch circuit, and
   fix the phase control signal to a predetermined level.

3. The clock data recovery circuit of claim 1, wherein the phase detector circuit further comprises a pulse adjustment circuit configured to increase a pulse width of the phase control signal received from the edge detection circuit.

4. The clock data recovery circuit of claim 3, wherein the pulse adjustment circuit is configured to increase a pulse width of the phase control signal from a point in time at which the second sample signal starts to be output from the sampling latch circuit to a point in time at which a third sample signal starts to be output from the input data signal at a third edge next to the second edge of the first reference clock signal.

5. The clock data recovery circuit of claim 3,
   wherein the first sample signal includes a first positive sample signal and a first negative sample signal, and
   wherein the pulse adjustment circuit includes a latch configured to perform a set operation and a hold operation on the phase control signal based on the first positive sample signal and the first negative sample signal.

6. The clock data recovery circuit of claim 1,
   wherein the input data signal includes a positive input data signal and a negative input data signal,
   wherein the first sample signal includes a first positive sample signal and a first negative sample signal, and
   wherein the sampling latch circuit comprises:
      a latch configured to generate a positive output signal and a negative output signal based on the first reference clock signal, the positive input data signal, and the negative input data signal; and
      inverters configured to output the first positive sample signal and the first negative sample signal by inverting the positive output signal and the negative output signal.

7. The clock data recovery circuit of claim 1,
   wherein the first sample signal includes a first positive sample signal and a first negative sample signal,
   wherein the second sample signal includes a second positive sample signal and a second negative sample signal, and
   wherein the edge detection circuit includes a circuit configured to perform a dynamic XNOR operation based on the first positive sample signal, the first negative sample signal, the second positive sample signal, and the second negative sample signal.

8. The clock data recovery circuit of claim 1, further comprising:
   a voltage control oscillator circuit configured to generate clock signals that are sources of the first reference clock signal and the second reference clock signal;
   a charge pump circuit configured to adjust a charge supply in response to the phase control signal; and
   a loop filter circuit configured to,
      generate a voltage signal by accumulating charges supplied by the charge pump circuit, and
      output the generated voltage signal to the voltage control oscillator circuit.

9. The clock data recovery circuit of claim 1,
   wherein the clock recovery circuit is configured to receive the input data signal based on a serial communication method, and
   wherein the data recovery circuit is configured to output the recovery data signal based on a parallel communication method.

10. The clock data recovery circuit of claim 1, wherein the phase detector circuit includes a bang-bang phase detector circuit.

11. A phase detector configured to detect a phase of an embedded clock signal by using an input data signal including the embedded clock signal and a plurality of reference clock signals having different phases, the phase detector comprising:
   a sampling latch circuit configured to sequentially output sample signals from the input data signal at edges of the plurality of reference clock signals;
   an edge detection circuit configured to, perform a comparison operation by using the sample signals, generate a phase control signal for tracking a phase of the embedded clock signal based on a result of the comparison operation, reset the phase control signal in a first period, and fixing the phase control signal to a predetermined level; and a pulse adjustment circuit configured to, set the phase control signal to have a level in accordance with the operation result in a second period following the first period, and control the phase control signal to hold a level in accordance with the operation result in a third period following the second period.

12. The phase detector of claim 11, wherein the first period corresponds to a difference in a point in time at which sample signals start to be output from the sampling latch circuit.

13. The phase detector of claim 11, wherein the sampling latch circuit comprises:

a sampling latch configured to, receive the input data signal and at least one reference clock signal from among the plurality of the reference clock signals, generate the sample signal by sampling the input data signal at an edge of the received at least one reference clock signal, and output the sample signal to a next edge of the received at least one reference clock signal; and an inverter configured to invert the sample signal output from the sampling latch.

14. The phase detector of claim 11, wherein the edge detection circuit comprises:

an edge detector circuit configured to generate the phase control signal by performing a comparison operation on two sample signals among the sample signals from a point in time at which the two sample signals start to be received from the sampling latch circuit.

15. The phase detector of claim 14, wherein the pulse adjustment circuit comprises:

a latch connected to an output node of the edge detector circuit and configured to perform a set operation and a hold operation on the phase control signal received from the edge detector circuit.

16. The phase detector of claim 11, wherein the edge detection circuit and the pulse adjustment circuit are configured to periodically repeat an operation on the phase control signal in the first to third periods until a recovery clock signal corresponding to the embedded clock signal is generated.

17. An apparatus configured to receive a serial communication-based input data signal, the apparatus comprising:

a clock recovery circuit including a phase detector circuit for generating a recovery clock signal from the serial communication-based input data signal, wherein the phase detector circuit comprises:

a sampling latch circuit configured to, output a first sample signal from the input data signal at a first edge of a first reference clock signal in a period from the first edge of the first reference clock signal to a second edge of the first reference clock signal, and output a second sample signal from the input data signal at a first edge of a second reference clock signal having a first phase difference from the first reference clock signal in a period from the first edge of the second reference clock signal to a second edge of the second reference clock signal;

an edge detection circuit configured to, perform a comparison operation on the first sample signal and the second sample signal from a point in time at which the first sample signal and the second sample signal start to be received from the sampling latch circuit, and generate a phase control signal configured to control phases of the first reference clock signal and the second reference clock signal based on a result of the comparison operation; and a pulse adjustment circuit configured to increase a pulse width of the phase control signal received from the edge detection circuit.

18. The apparatus of claim 17, wherein the edge detection circuit is configured to reset the phase control signal from a point in time at which the first sample signal starts to be output from the sampling latch circuit to a point in time at which the second sample signal starts to be output from the sampling latch circuit.

19. The apparatus of claim 17, wherein the pulse adjustment circuit comprises:

a latch configured to perform a set operation and a hold operation on the phase control signal based on the first sample signal.

20. The apparatus of claim 17, further comprising:

a data recovery circuit configured to generate a recovery data signal from the input data signal by using the recovery clock signal, wherein the data recovery circuit is configured to output the recovery data signal based on a parallel communication method.

* * * * *